(12) United States Patent
Beery et al.

(10) Patent No.: US 10,937,479 B1
(45) Date of Patent: Mar. 2, 2021

(54) INTEGRATION OF EPITAXIALLY GROWN CHANNEL SELECTOR WITH MRAM DEVICE

(71) Applicant: Spin Memory, Inc., Fremont, CA (US)

(72) Inventors: Dafna Beery, Palo Alto, CA (US); Amitay Levi, Cupertino, CA (US); Andrew J. Walker, Mountain View, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/555,150

(22) Filed: Aug. 29, 2019

(51) Int. Cl.
| | |
|---|---|
| G11C 11/16 | (2006.01) |
| H01L 21/20 | (2006.01) |
| H01L 21/02 | (2006.01) |
| H01L 43/02 | (2006.01) |

(52) U.S. Cl.
CPC ...... *G11C 11/161* (2013.01); *H01L 21/02293* (2013.01); *H01L 21/20* (2013.01); *H01L 43/02* (2013.01)

(58) Field of Classification Search
CPC . G11C 11/161; H01L 21/02293; H01L 21/20; H01L 43/02
See application file for complete search history.

(56) References Cited

U.S. PATENT DOCUMENTS

| | | | |
|---|---|---|---|
| 8,324,682 B2 | 12/2012 | Chen et al. | |
| 10,355,045 B1 | 7/2019 | Kim et al. | |
| 10,468,293 B2 * | 11/2019 | Kim | H01L 29/7827 |
| 10,658,425 B2 * | 5/2020 | Kim | H01L 43/02 |
| 2010/0124813 A1 | 5/2010 | Matamis et al. | |
| 2011/0269251 A1 | 11/2011 | Kim et al. | |
| 2012/0009747 A1 | 1/2012 | Kang et al. | |
| 2013/0307513 A1 * | 11/2013 | Then | H01L 21/02636 323/311 |
| 2014/0124726 A1 | 5/2014 | Oh | |
| 2019/0206716 A1 * | 7/2019 | Kim | H01L 29/66666 |
| 2019/0206941 A1 * | 7/2019 | Kim | H01L 29/7827 |
| 2020/0006628 A1 * | 1/2020 | O'Brien | H01F 41/302 |
| 2020/0066741 A1 * | 2/2020 | Wu | H01L 29/7889 |
| 2020/0127052 A1 * | 4/2020 | Walker | H01L 43/12 |

OTHER PUBLICATIONS

Restriction Requirement from U.S. Appl. No. 16/685,873, dated May 21, 2020.

(Continued)

*Primary Examiner* — Tri M Hoang
(74) *Attorney, Agent, or Firm* — Zilka-Kotab, P.C.

(57) ABSTRACT

A magnetic memory array having an epitaxially grown vertical semiconductor selector connected with a memory element via a bottom electrode such as TaN. An electrically conductive contact such as tungsten (W) or TaN can be included between the vertical semiconductor channel and the TaN bottom electrode. The electrically conductive contact and the TaN bottom electrode can both be formed by a damascene process wherein an opening is formed in an oxide layer and a metal is deposited into the opening. A chemical mechanical polishing process can then be performed to remove portions of the metal that extend out of the opening in the oxide layer over the oxide surface.

12 Claims, 36 Drawing Sheets

(56) References Cited

OTHER PUBLICATIONS

Capogreco et al., "Integration and electrical evaluation of epitaxially grown Si and SiGe channels for vertical NAND Memory applications," IEEE 7th International Memory Workshop, 2015, 4 pages.
Beery et al., U.S. Appl. No. 16/685,873, filed Nov. 15, 2019.
Lisoni et al., "Laser Thermal Anneal of polysilicon channel to boost 3D memory performance," IEEE Symposium on VLSI Technology: Digest of Technical Papers, 2014, 2 pages, retrieved from https://ieeexplore.ieee.org/document/6894346.
Notice of Allowance from U.S. Appl. No. 16/685,873, dated Nov. 18, 2020.
International Search Report and Written Opinion from PCT Application No. PCT/US20/48282, dated Jan. 8, 2021.

* cited by examiner

INTEGRATION OF EPITAXIALLY GROWN CHANNEL SELECTOR WITH MRAM DEVICE

FIELD OF THE INVENTION

The present invention relates to magnetic random-access memory (MRAM) and more particularly to the electrical connection of a memory element with an epitaxially grown semiconductor via a bottom electrode located there-between.

BACKGROUND

Magnetic Random-Access Memory (MRAM) is a non-volatile memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

While the above memory element has been described in terms of a perpendicular magnetic tunnel junction element, this is by way of example. Other types of magnetic memory elements are available as well, such as but not limited to longitudinal magnetic tunnel junction elements.

SUMMARY

The present invention provides a magnetic memory structure that includes a selector comprising an epitaxial semiconductor column having a side surrounded by gate dielectric and an electrically conductive gate line located such that the gate dielectric separates the epitaxial semiconductor column from the electrically conductive gate line. The magnetic memory structure also includes a magnetic tunnel junction structure and a bottom electrode located between and electrically connecting the magnetic tunnel junction with the epitaxial semiconductor column.

The epitaxial semiconductor column provides an efficient vertical transistor structure that greatly increases memory density by greatly reducing the spacing between memory cells. The epitaxial semiconductor provides efficient conduction of current through the transistor selector which advantageously allows the diameter of the semiconductor selector transistor to be further reduced, thereby allowing for even greater increases in memory cell density.

The bottom electrode can be formed to contact both the vertical semiconductor channel structure and the magnetic tunnel junction structure. Alternatively, an electrically conductive contact formed of a material such as tungsten (W) or tantalum nitride (TaN) can be located between the TaN bottom electrode and the epitaxial semiconductor column.

The bottom electrode can advantageously be constructed to have a width or diameter that is larger than that of the magnetic tunnel junction structure. This facilitates manufacture by reducing the need for tight alignment of multiple patterning processes.

The magnetic memory device can be constructed by a process that includes forming a gate structure over a semiconductor substrate. The gate structure can include an electrically conductive gate layer located between upper and lower dielectric layers. An opening can be formed in the gate structure, and a gate dielectric can be deposited into the side-wall of the opening. The gate dielectric can be removed from the bottom of the opening to expose the underlying Si substrate. Then, this exposed portion of the Si substrate can be treated, such as with HCl to remove any oxide from the surface of the exposed Si substrate. A column of Si can then be epitaxially grown into the opening such as by reduced pressure chemical vapor deposition. A bottom electrode can be formed over the Si column, and a magnetic tunnel junction element can be formed over the bottom electrode.

The epitaxially grown Si channel has greatly improved electrical conductivity as compared with other types of selector structures. This is especially beneficial in use with magnetic memory structures, as these memory structures require relatively high current flow in order to achieve magnetic switching of the magnetic tunnel junction memory element in a magnetic memory system. The epitaxially grown semiconductor structure can be constructed by a process such as described in research paper entitled, Integration and Electrical Evaluation of Epitaxial Grown Si and SiGe Channels for Vertical NAND Memory Applications, by Imec Corporation®, July 2015.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

The following description includes the best embodiments presently contemplated for carrying out the invention. This description is made for the purpose of illustrating the general principles of this invention and is not meant to limit the inventive concepts claimed herein in any way.

Figure 1:
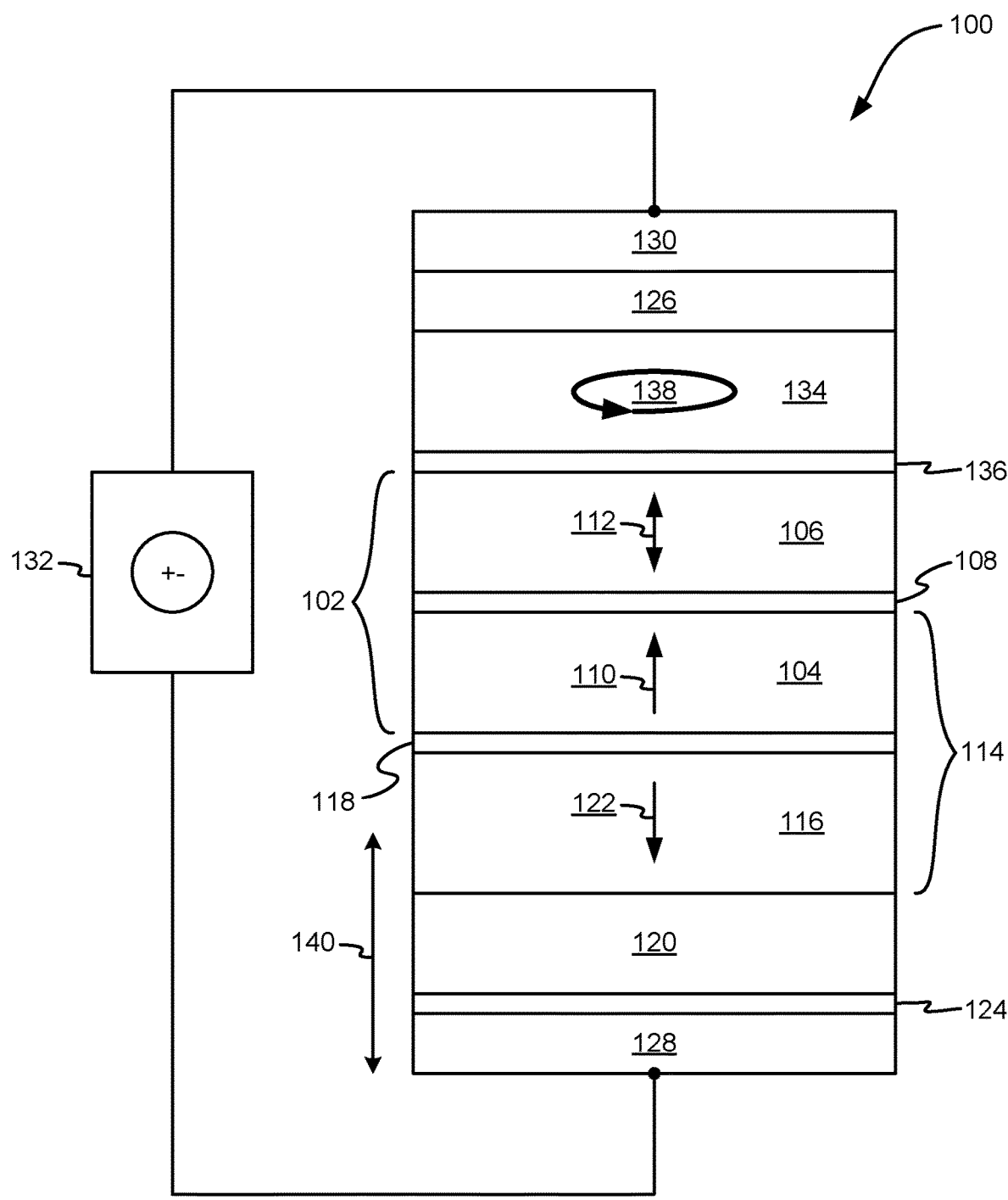
FIG. 1 is a schematic representation of a cross-sectional view of a portion of a magnetic memory element, which may be used in embodiments of the invention.

Referring to FIG. 1, a magnetic memory element 100 is shown according to one embodiment of a possible resistive memory device for use in a memory array. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art.

The reference layer 104 has a magnetization 110 that is fixed in a direction that is perpendicular to a horizontal plane of the layer, as indicated by the arrow. The horizontal plane is sometimes referred to as a plane of formation in the embodiments described herein. The reference layer 104 may include CoFeB30 or CoFeB40, or some other suitable material known in the art.

The free layer 106 has a magnetization 112 that may be in either of two directions perpendicular to a horizontal plane of the free layer 106, as indicated by the two arrows. The free layer 106 may include CoFeB20/W/CoFeB20, or some other suitable material known in the art. While the magnetization 112 of the free layer 106 remains in either of two directions perpendicular to the plane of the free layer 106 in a quiescent state, it may be selectably switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru or a Ru/cobalt stack, and may be constructed to have a thickness that causes ferromagnetic antiparallel coupling of the pinned layer 116 and the reference layer 104. In some approaches, the pinned layer 116 may be a ferromagnetic layer, such as molybdenum (Mo) or cobalt (Co) coupled to reference layer 104 through antiparallel coupling layer 118.

In one approach, the pinned layer 116 may be exchange coupled with an antiferromagnetic layer 120, which may comprise any suitable material known in the art, such as IrMn. In some approaches, the AFM layer may be a series of layers of synthetic anti-ferromagnetic (SAF) materials, for example a SAF seed layer that includes platinum (Pt) and a set of SAF layers comprising alternating cobalt (Co)/Pt.

Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove. In one approach, a seed layer 124 may include Ta. In some approaches, an underlayer (not shown) may be positioned above the seed layer. In one approach, an underlayer may include Ru.

In another approach, a capping layer 126 may be positioned above the free layer 106 to protect the underlying layers during manufacture, such as during hard mask etching. In some approaches, the capping layer 126 may include Ta/Ru, or some suitable material known in the art.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, TaN, Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the plane of the free layer 106. In a write mode, the orientation of the magnetization 112 of the free layer 106 can be switched between these two directions by applying an electrical current through the memory element 100 from the circuitry 132. A current in one direction will cause the memory element to flip to a first orientation, and a current in an opposite direction will cause the magnetization to flip to a second, opposite direction. For example, if the magnetization 112 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 110 of the reference layer 104. These spin polarized electrons cause a spin torque on the magnetization 112 of the free layer 106, which causes the magnetization to flip directions.

On the other hand, if the magnetization 112 of the free layer 106 is initially in a downward direction in FIG. 1, applying an electrical current through the element 100 in an upward direction will cause electrons to flow in an opposite direction, downward through the element 100. However, because the magnetization 112 of the free layer 106 is opposite to the magnetization 110 of the reference layer 104, the electrons with an opposite spin will not be able to pass through the barrier layer 108 to the reference layer 104. As a result, the electrons having an opposite spin will accumulate at the junction between the free layer 106 and barrier layer 108. This accumulation of spin polarized electrons causes a spin torque that causes the magnetization 112 of the free layer 106 to flip from a downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches. In addition, the perpendicular magnetic tunnel junction (pMTJ) described above is merely one example of one type of memory element that might be used in a memory array. Other types of memory element could also be used, such as but not limited to in-plane magnetic tunnel junction, a phase change memory element, toggle memory, etc.

Figure 2:
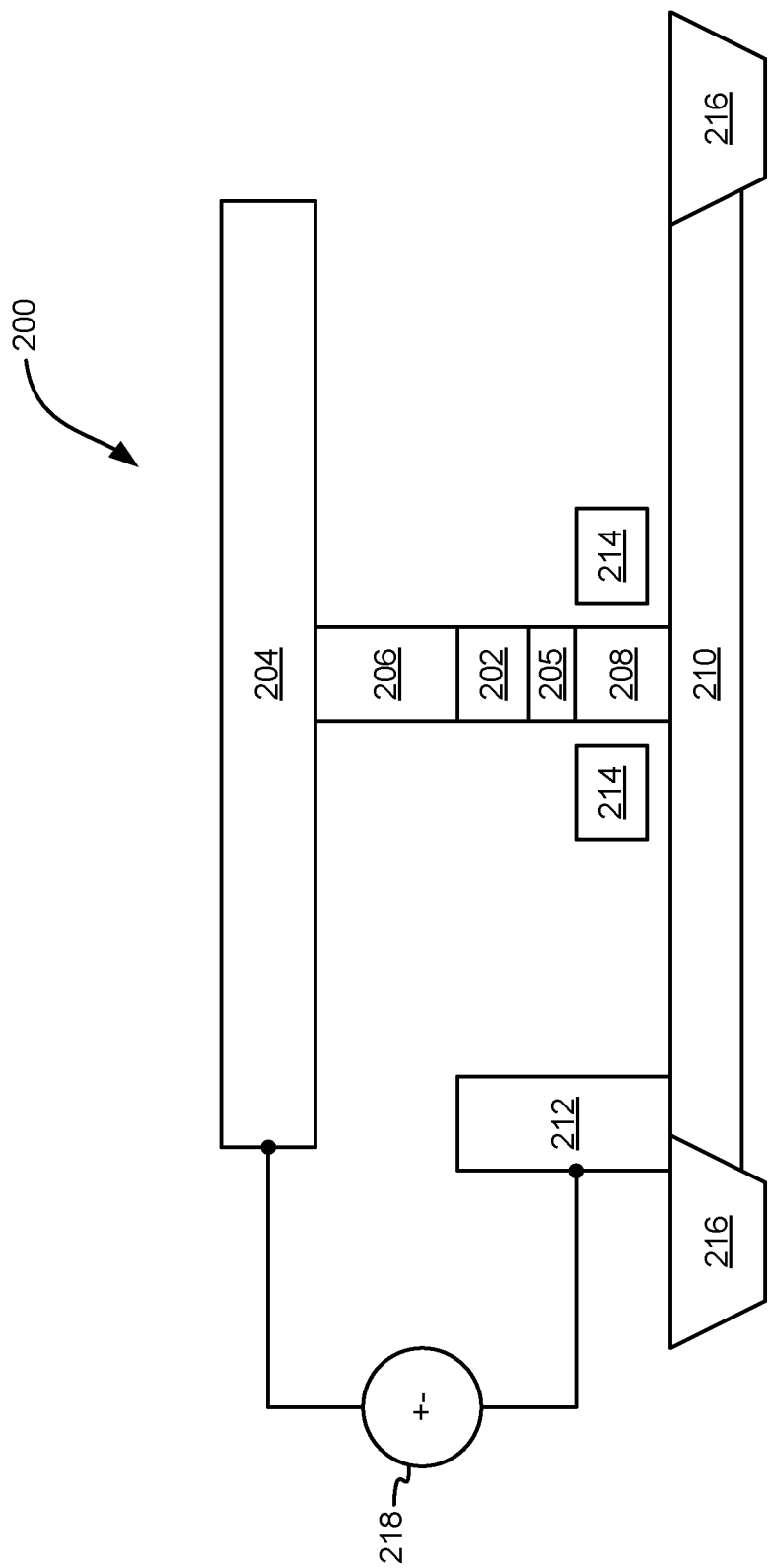
FIG. 2 is a schematic representation of a cross-sectional view of a portion of a magnetic random access memory (MRAM) that includes a magnetoresistive cell, which may be used in embodiments of the invention.

Now referring to FIG. 2, a portion of a magnetic random access memory (MRAM) structure 200 that includes a magnetoresistive cell 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive cell 202 of FIG. 2 in accordance with embodiments that store data in MRAM. In one embodiment, an MTJ element may be used as the magnetoresistive cell 202, however other types of memory elements could be used as the memory element 202, such as, but not limited to, in-plane magnetic tunnel junction, phase change memory, toggle memory, etc.

The MRAM cell 200 also includes a bitline 204 that supplies current across the magnetoresistive memory element 202 from a current source 218. The bitline 204 may include any suitable material known in the art, such as TaN, W, TiN, Au, Ag, Cu, Al, etc. An electrically conductive connecting via 206 electrically connects the magnetoresistive memory element 202 with the bitline 204. The extension layer 206 may include any suitable material known in the art, such as Ru, Ta, TaN, W etc. A source terminal 205 is coupled between the magnetoresistive memory element 202 and a channel layer 208, the channel layer 208 further being in electrical contact with a n+ layer 210. The channel layer 208 may include any suitable semiconductor material known in the art, such as Si, SiGe, GaAs-compounds, etc. The n+ layer 210 may include any suitable material known in the art, such as phosphorous-doped silicon, arsenide-doped silicon, doped silicon cladded with TaN, W, TiN, Au. Ag, Cu, etc., and is electrically connected to the current source 218 via a sourceline 212, which may include any suitable material known in the art, such as TaN, W, TiN, Au, Ag, Cu, Al, etc. Positioned across the channel layer 208 is a word line 214 which may include any suitable material known in the art, such as TaN, W, TiN, Au, Ag, Cu, Al, etc. On either side of the n+ layer 210 are shallow trench isolation (STI) layers 216 which provide electrical insulation between the n+ layer 210 and adjacent n+ layers (not shown). Moreover, although not specifically shown, electrically insulative material may be positioned around the various layers shown in FIG. 2, as would be understood by one of skill in the art.

Figure 3:
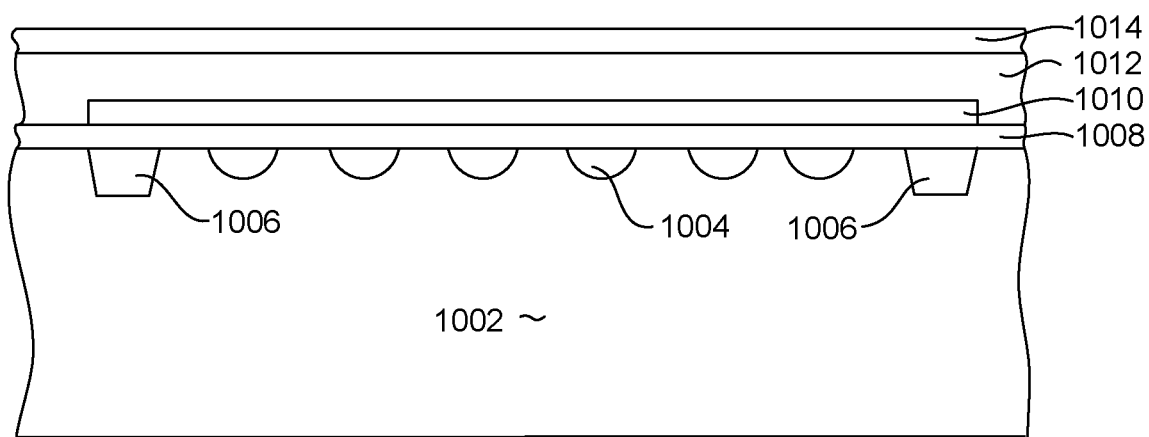
FIGS. 3-12 are schematic representations of a wafer in various intermediate stages of manufacture illustrating a method for manufacturing a magnetic memory array having epitaxially grown transistors.

FIGS. 3-8 show a wafer in various intermediate stages of manufacture in order to illustrate a method for manufacturing epitaxially grown transistors for selecting a memory element cell in a memory array. With reference to FIG. 3, a substrate 1002 is provided. The substrate 1002 can be a material such as Si as part of a silicon wafer. A plurality of n+ doped regions 1004 are formed into a surface of the substrate 1002. The n+ doped regions 1004 can be formed by locally doping selected regions of the substrate 1002 with a doping material such as As or P. Isolation trenches 1006 can be formed to electrically isolate a row of n+ doped regions 1004 from other rows of n+ doped regions. The isolation trench 1006 can be formed of an electrically insulating material. A dielectric layer 1008 is deposited over the surface of the substrate 1002, over the n+ doped regions 1004 and over the isolation trenches 1006. The dielectric layer 1008 can be a material such as SiOx or SiNx.

With continued reference to FIG. 3, a gate material layer 1010 is formed over the dielectric layer. The gate material 1010 can be a material such as poly-silicon, W, TiNi, TaN, TiN, and Ti, and is formed to define a word line such as previously described. A dielectric material 1012 is deposited over the gate material 1010. The dielectric material 1012 is preferably an oxide, such as silicon oxide, silicon nitride or a metal oxide (such as $HfO_2$, $Al_2O_3$, etc.). A layer of material that is resistant to chemical mechanical polishing (CMP stop layer) 1014 can optionally be deposited over the dielectric layer 1012, but is not required. If used, the CMP stop layer 1014 can be a nitride, such as SiNx.

Figure 4:
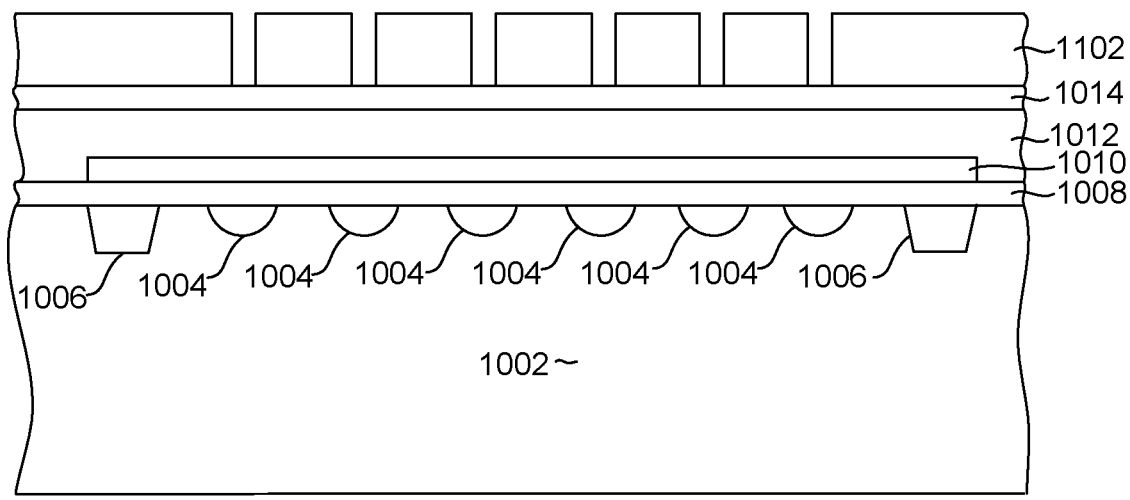
Figure 5:
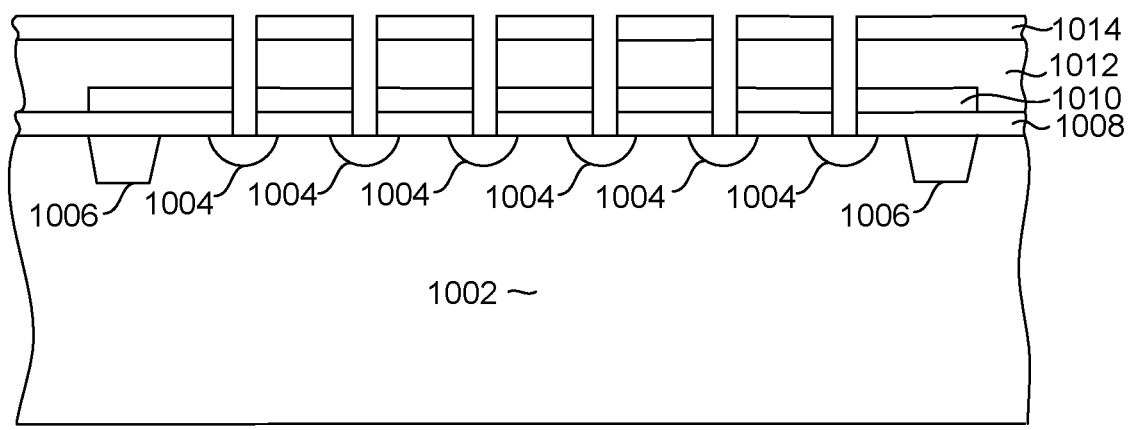

Then, with reference to FIG. 4, a mask stack 1102 is deposited over the CMP stop layer, or over the dielectric layer. The mask 1102 can include various layers, such as but not limited to a hard mask layer an anti-reflective layer and a patterned photoresist layer. The mask 1102 is configured with openings that will define semiconductor structures, as will be seen.

A material removal process such as reactive ion etching or ion milling is then performed to transfer the image of the mask structure 1102 onto the underlying layers 1014, 1012, 1010, 1008 by removing portions of these layers that are exposed through the openings in the mask structure 1102. After the material removal process has been performed sufficiently to stop on the n-doped regions 1004, the mask structure 1102 can be removed, leaving a structure such as that shown in FIG. 5.

Figure 6:
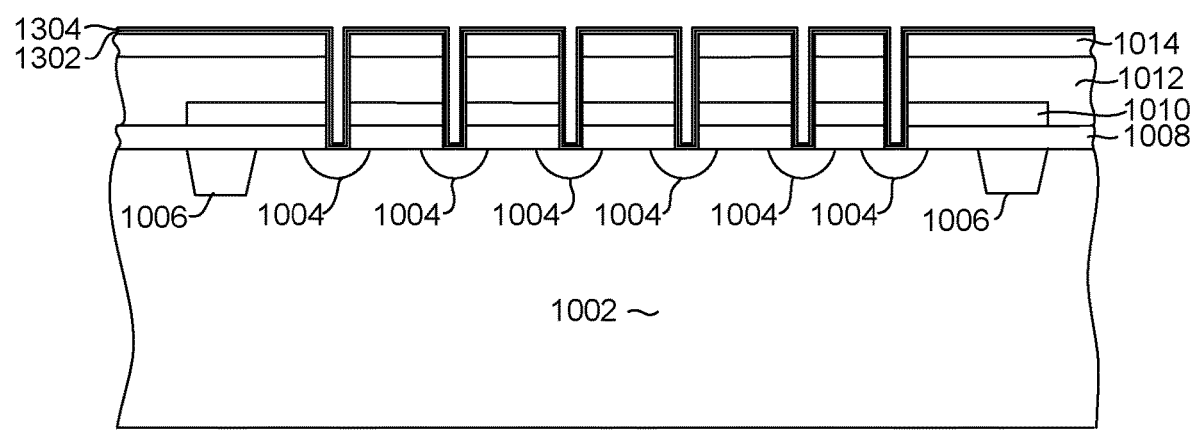
Figure 7:
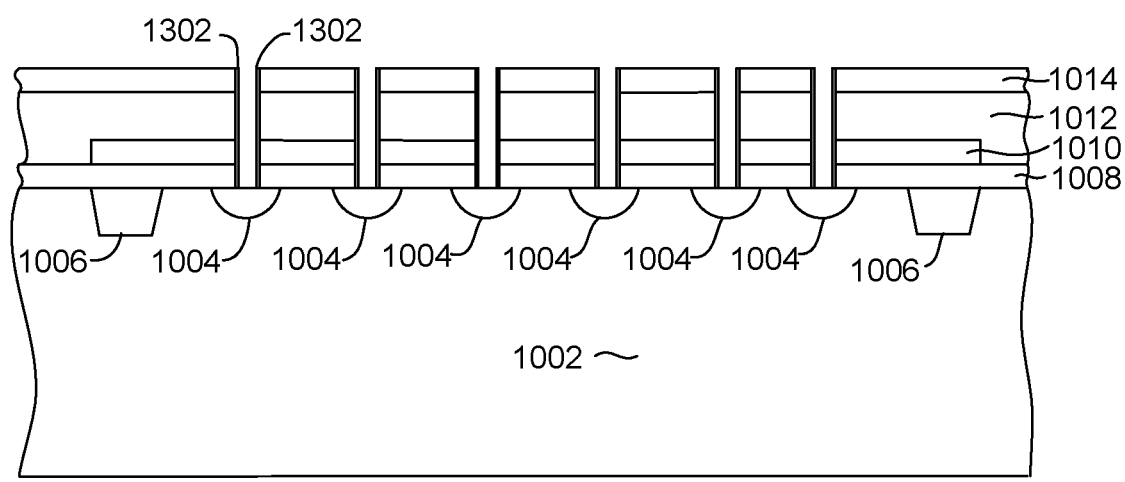

Then, with reference to FIG. 6, a gate dielectric material 1302, such as $SiO_2$, $HfO_2$, $Al_2O_3$ or $ZrO_2$, is deposited by a conformal deposition process such as atomic layer deposition (ALD) or chemical vapor deposition (CVD). A protective layer 1304 is then deposited over the gate dielectric layer 1302. The protective layer 1304 is preferably a material having a desired etch selectivity to the gate dielectric so that it can be removed by etching (such as reactive ion etching or wet etch) while leaving the underlying gate dielectric material 1302 substantially intact. For example, if the gate dielectric material 1302 is $SiO_2$ or $HfO_2$, the protective layer 1304 could be Si. The protective layer 1304 is preferably deposited by a conformal deposition process such as atomic layer deposition (ALD) or chemical vapor deposition (CVD).

An anisotropic material removal process such as ion milling or reactive ion etching RIE is then performed to preferentially remove horizontally disposed portions of the gate dielectric layer 1302 and protective layer 1304 from the bottom of the opening. This material removal process is performed sufficiently to remove the gate dielectric and protective layer 1302, 1304 at the bottom of the channel openings so as to expose the n+ doped regions 1004 of the substrate 1002. A material removal process such as reactive ion etching is then performed to selectively remove the protective layer 1304 from the channel sidewalls, leaving the gate dielectric intact and forming a structure such as that shown in FIG. 7. The reactive ion etching is preferably performed using a chemistry that selectively removes the material of the protective layer 1304.

After gate dielectric layer 1302 has been removed at the bottoms of the openings, a surface cleaning can be performed on the surface of the remaining gate dielectric 1302. After the surface cleaning, the surface of the gate dielectric layer 1302 can be passivated, such as by exposure to nitrogen.

Figure 8:
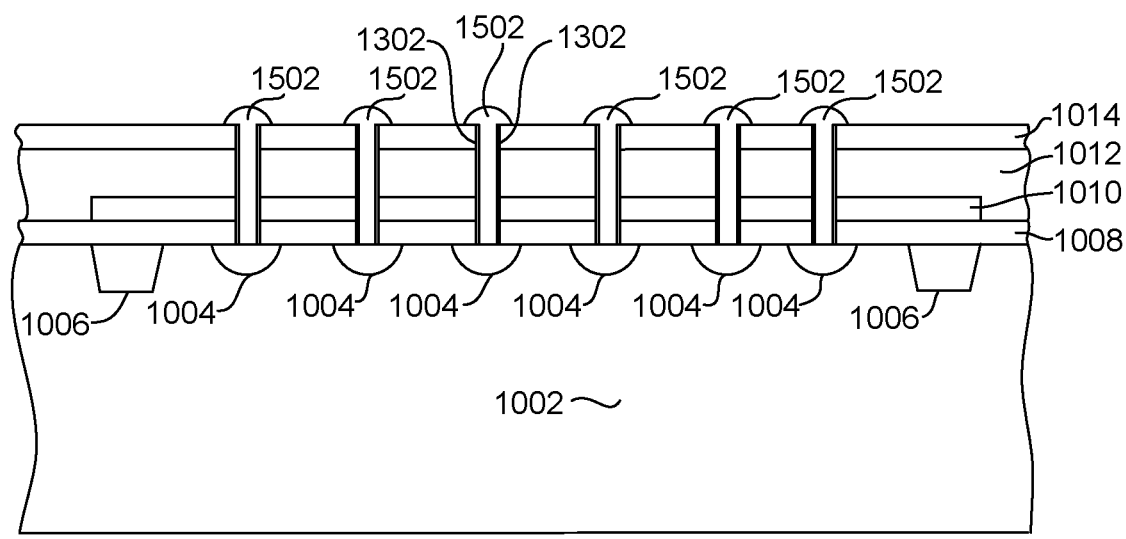
Figure 9:
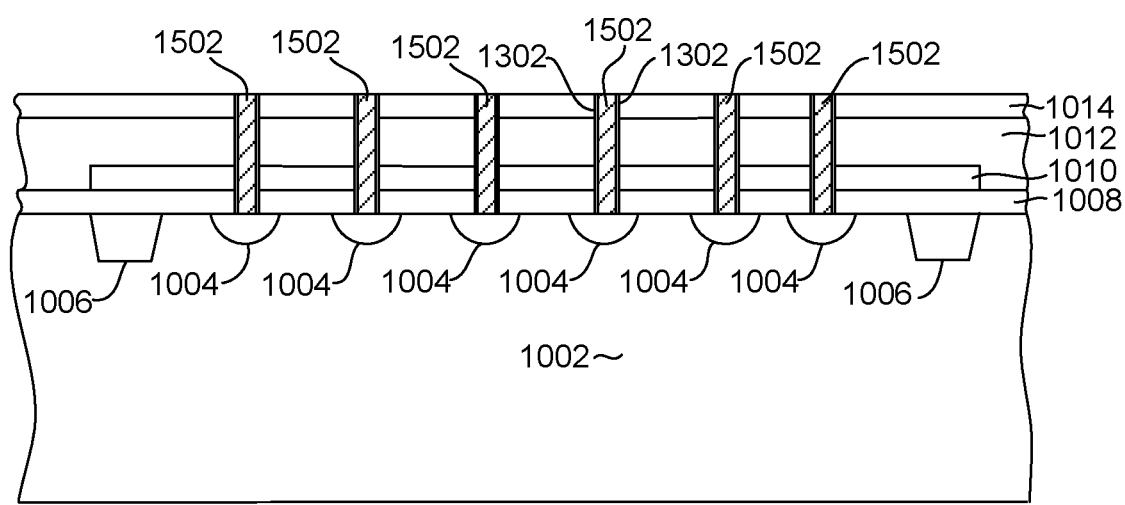

Then, with reference to FIG. 8, epitaxial silicon 1502 is grown to fill the previously formed openings. In addition to filling the openings, the epitaxial silicon 1502 may extend out of the openings to form a "mushroom" shape as shown in FIG. 8, or alternatively the epitaxial growth of Si can be terminated before the Si 1502 reaches the tops of the openings. A chemical mechanical polishing can then be performed to remove excess silicon, leaving a structure as shown in FIG. 9. A high temperature annealing can be performed to drive ions from the doped semiconductor substrate 1002 into the bottom region of the semiconductor column 1502 to from a doped source region at the bottom of the column.

The upper portion of the Si channel structure 1502 can be implanted (doped). This can be accomplished by depositing doped semiconductor material on top of the channel or by a process such as implanting ions into the upper region of the semiconductor column such ion bombardment followed by a thermal annealing. Following this, the poly-Si can be removed from the surface, such as by chemical mechanical polishing.

Figure 10:
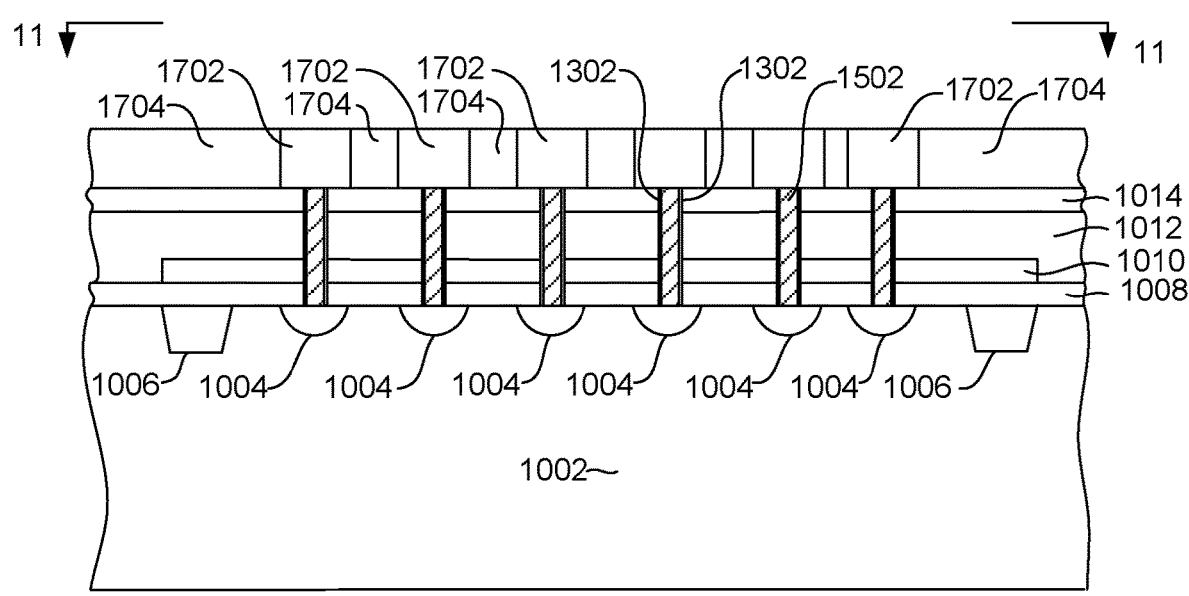

Then, with reference to FIG. 10, a series of electrically conductive metal contact structures 1702 are formed over each of the epitaxial Si structures 1502 and dielectric layers 1014. The contact structures 1702 are embedded in a dielectric layer 1704 such as $SiO_2$ and, at this point in the process, the contacts 1702 and surrounding oxide 1704 may have co-planar upper surfaces. The contact and oxide structures 1702, 1704 can be formed by a process that includes, first depositing the dielectric layer 1704, and then masking and etching the dielectric 1704 to form openings over the channel structures 1502, and then forming the contact structures 1702, such as by depositing an electrically conductive material such as Ta, TaN, W, etc. into the openings in the dielectric layer 1704 and then performing a chemical mechanical polishing process to remove the conductive material from the wafer surface.

Figure 11:
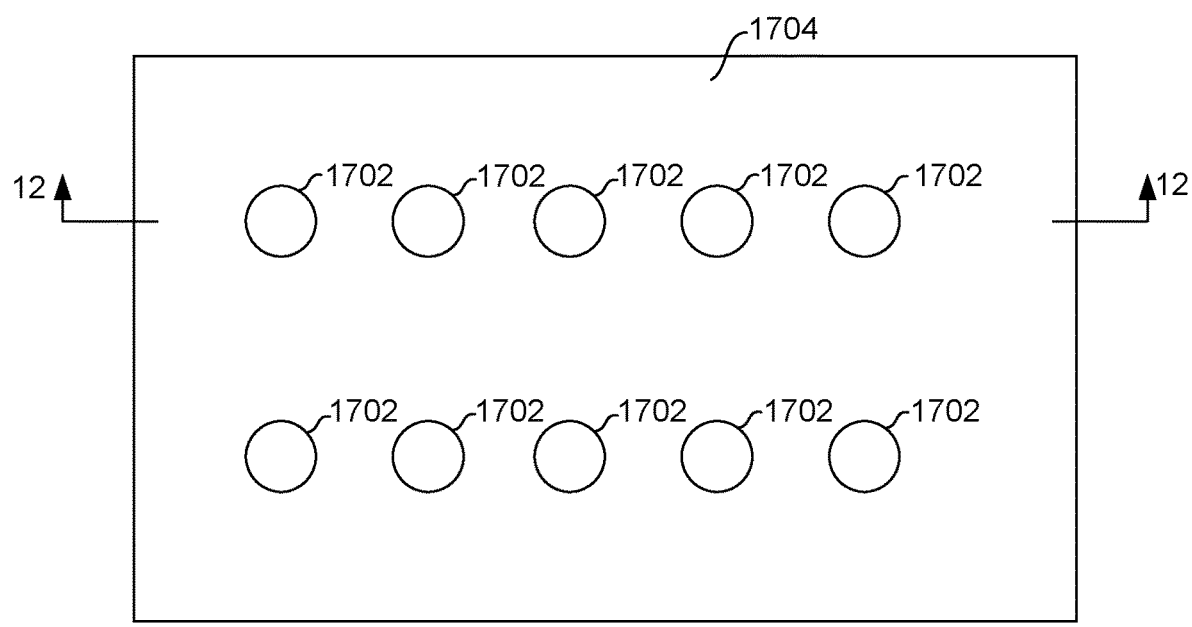

FIG. 11 shows a top-down view as seen from line 11-11 of FIG. 10. After forming the contacts 1702 and surrounding oxide 1704, in one possible embodiment an optional etching process can be performed to remove a portion of the contact structures 1702 to cause the contacts 1702 to be recessed in the surrounding oxide 1704.

Figure 12:
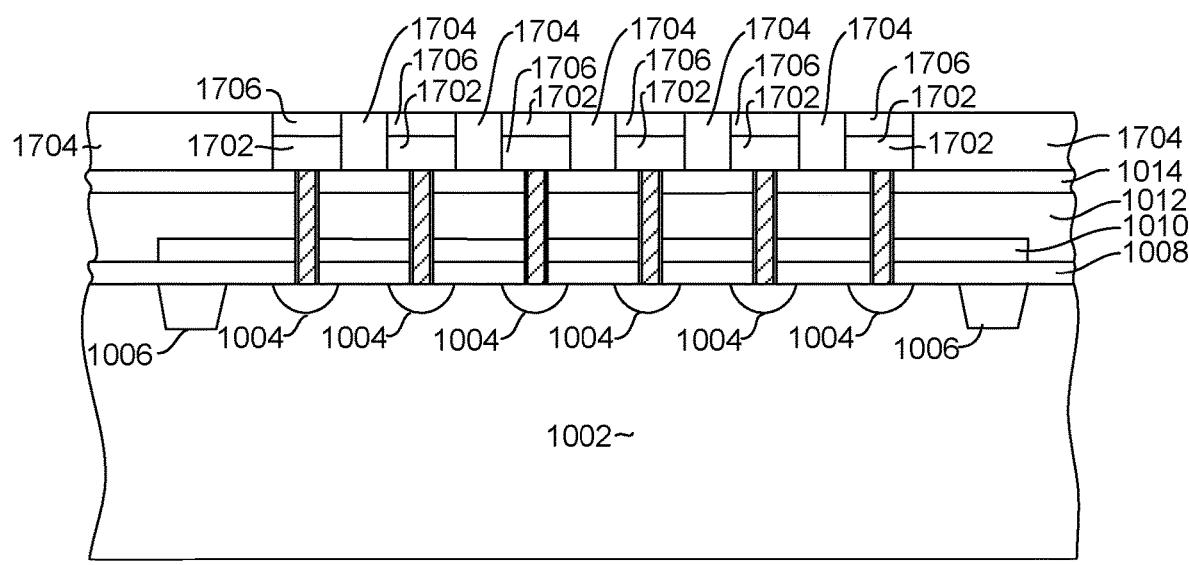

According to one embodiment, after the etching process has been performed, a bottom electrode layer (preferably TaN) 1706 is deposited, followed by a chemical mechanical polishing (CMP), leaving a structure as shown FIG. 12, which is a view taken from line 12-12 of FIG. 11 with the bottom electrode 1706 being formed over and self-aligned with the contact material 1702. As shown in FIG. 12, the CMP process is performed sufficiently to expose the electrical contacts 1702.

Figure 13:
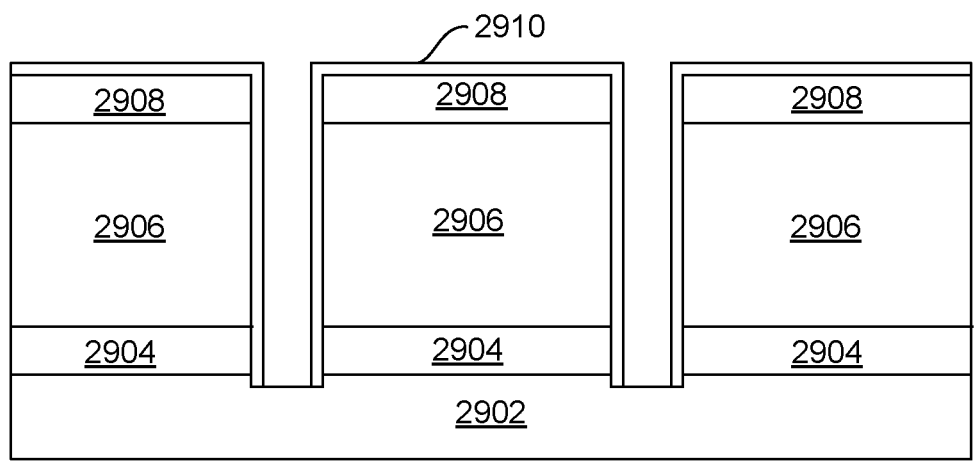
FIGS. 13-26 show a portion of a magnetic memory array in various intermediate stages of manufacture in order to illustrate a method for manufacturing a magnetic memory array according to an embodiment.

FIGS. 13-26 show cross sectional view of a magnetic memory structure in various intermediate stages of manufacture in order to illustrate a method of manufacturing a magnetic memory structure according to an embodiment. With reference to FIG. 13, a substrate 2902 is provided. The substrate 2902 can be a semiconductor substrate such as a silicon substrate having an n-doped region formed in a surface thereof that can form a source-line connecting with one or more memory element structures. A first dielectric layer 2904 such as an oxide is formed over the substrate 2902. A gate layer 2906 is deposited over the first dielectric layer 2904. The gate layer 2906 is an electrically conductive layer and can be poly crystalline silicon, which can be p-doped or n-doped. The electrically conductive gate layer 2906 can form a part of a word line for selecting one or more memory elements for writing or reading data. A second dielectric layer 2908, which also can be on oxide, is deposited over the electrically conductive gate layer 2906.

A masking and etching process can be performed to form openings in the first dielectric layer 2904, electrically conductive gate layer 2906 and second dielectric layer 2908. A thin gate dielectric layer 2910 is then deposited by an isotropic, conformal deposition technique such as atomic layer deposition, chemical vapor deposition, etc. to cover the interior walls of the opening. Then, an anisotropic etching such as ion etching is performed to remove the gate dielectric layer 2910 from the bottom of the opening in the layers 2904, 2906, 2908. This anisotropic etching is preferably performed until the openings extend slightly into the substrate 2902. Etching into the substrate 2902 provides a good surface for the epitaxial growth of semiconductor material thereon. The gate layer can be capped with a thin amorphous silicon sacrificial layer (not shown that can be used to protect the oxides during the opening of the bottom of the hole, which is required to provide electrical contact with the substrate 2902.

In order to provide a good surface for the epitaxial growth of Si, the substrate can be treated in order to remove its native oxide, and the residual amorphous Si sacrificial layer, if used, can be removed to allow an epitaxial growth exclusively from the bottom of the hole. This treatment can be accomplished by using a HCl vapor at about 900 degrees C.

Figure 14:
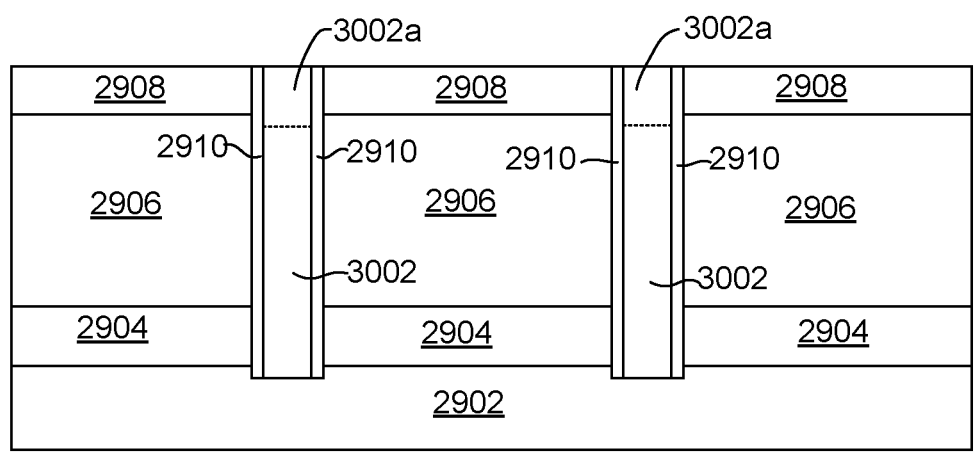

With reference now to FIG. 14, a semiconductor material such as Si, SiGe, or GaAs 3002 is epitaxially grown on the surface of the substrate 2902 that is exposed through the openings in layers 2904, 2906, 2908 and layer 2910. The epitaxial growth of semiconductor material 3002 can be accomplished by using a reduced pressure chemical vapor deposition system. Epitaxial Si 3002 is grown from the substrate 2902 upward. A high temperature annealing process can be performed to drive doping material from the substrate 2902 into the bottom portion of the column 3002 to form a doped source region in the bottom of the column 3002.

Optionally, the epitaxial growth of semiconductor 3002 can be terminated prior to reaching the top of the opening, and a doped polycrystalline semiconductor 3002a can be deposited at the upper portion of the openings, or an un-doped polycrystalline semiconductor material 3002a can be deposited and an implantation process such as ion bombardment can be performed to dope the deposited polycrystalline semiconductor 3002a to form a drain region 3002a at the top of the column 3002. Otherwise, the epitaxial growth of semiconductor can continue to form the entire semiconductor column 3002, and the upper portion later implanted to form an upper doped region. This doped upper portion upper portion 3002a provides a drain region for the semiconductor column 3002. Using a, non-epitaxially deposited layer can reduce manufacturing cost and time by allowing this drain region to be deposited by a faster less expensive depositions method, without significant detrimental effect on selector performance. Although this upper non-epitaxial layer is shown as 3002a in FIG. 14, later figures and descriptions herein do not show this separate layer 3002a of the column 3002. However, it should be understood that this optional non-epitaxial layer can be included in all of the below described embodiments of the semiconductor column 3002. The upper portion 3002a of the Si column 3002 can be doped (such as n+ doped) by depositing doped polysilicon 3002a or by ion implantation after deposition or epitaxial growth to provide a drain region. A heat treatment process can be used to drive n+ ions from the doped deposited polysilicon into Si immediately beneath the deposited, doped polysilicon.

The use of the epitaxially grown semiconductor column in a selector transistor structure greatly increases memory density in a memory array by greatly reducing the required spacing between memory cells. The epitaxial semiconductor column 3002 has been shown to provide greatly improved electrical conductivity as compared with other semiconductor structures, such as annealed polysilicon. This further reduces the necessary diameter of the selector structure which is especially useful in an application as described herein, wherein relatively large electrical currents are required to pass through the selector to drive a TMR magnetic memory element. Additionally, the improved conductivity allows the column 3002 to have a significantly smaller diameter than would otherwise be possible. This provide great advantage in increasing the density of a magnetic memory array employing such an epitaxial vertical channel. A chemical mechanical polishing process can be performed to remove any of the semiconductor material 3002a extending out of the openings, leaving a structure as shown in FIG. 14. The chemical mechanical polishing can be terminated at the dielectric layer 2908.

Figure 15:
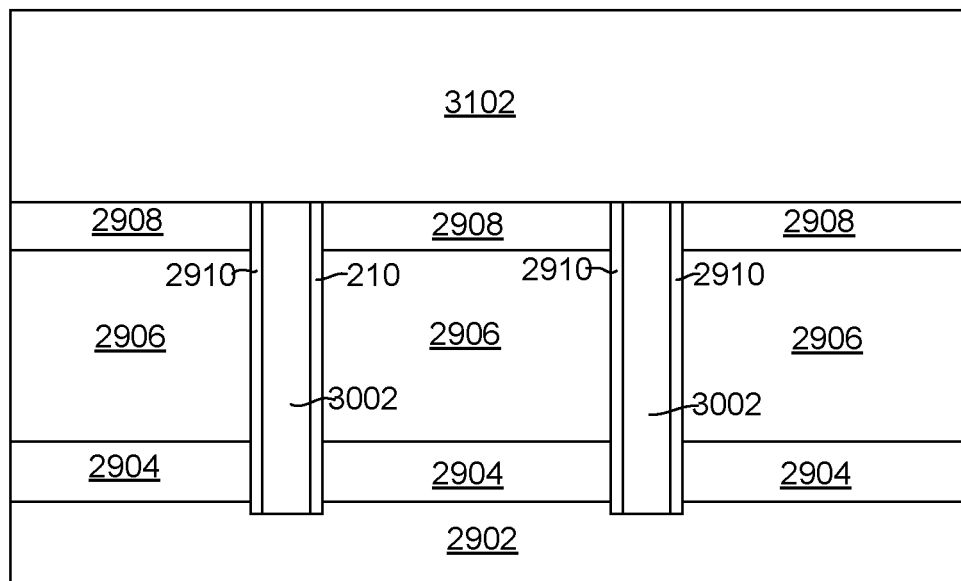
Figure 16:
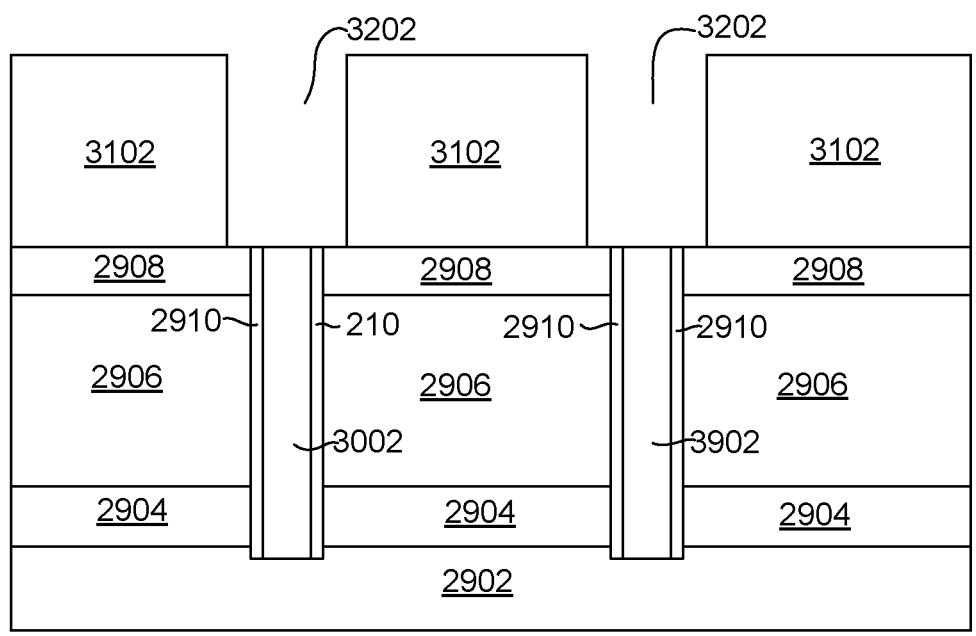

Then, with reference to FIG. 15, a dielectric layer 3102 is deposited. The dielectric layer 3102 is preferably an oxide such as $SiO_2$ and is deposited at least to a thickness of a desired contact height as will be seen. Then, with reference to FIG. 16, openings 3202 are formed in the dielectric layer 3102 at locations over the epitaxially grown semiconductor 3002 as shown in FIG. 16. The openings 3202 can be formed by lithographically patterning a mask structure (not shown) over the dielectric layer 3102, wherein the mask has openings at locations where the openings 3202 are to be formed. An etching process such as ion etching or reactive ion etching can then be performed to remove portions of the dielectric layer 3102 in the regions exposed by the openings in the mask. The etching is performed until the Si 3002a in the channel has been exposed.

Figure 17:
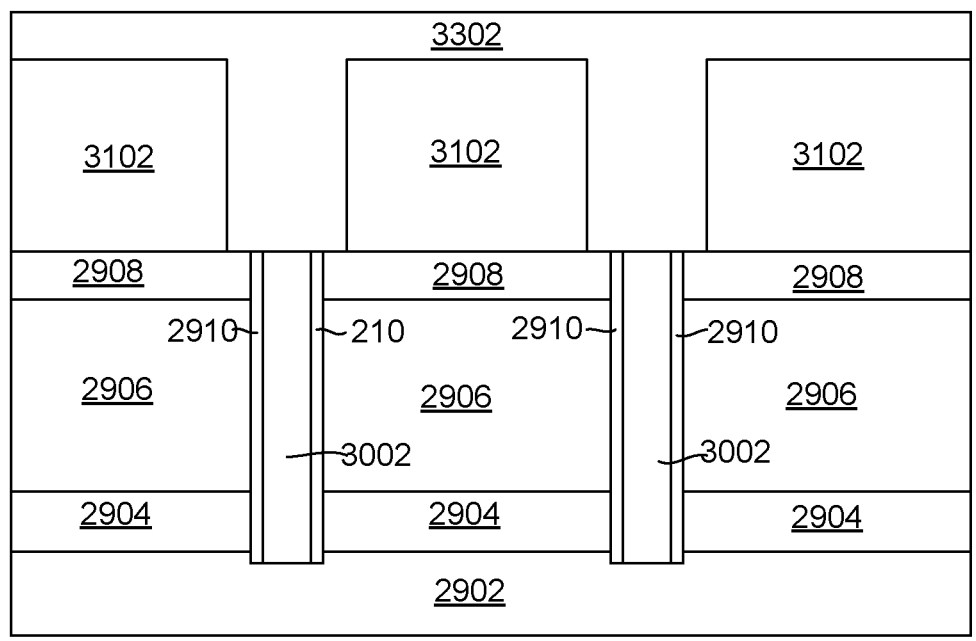
Figure 18:
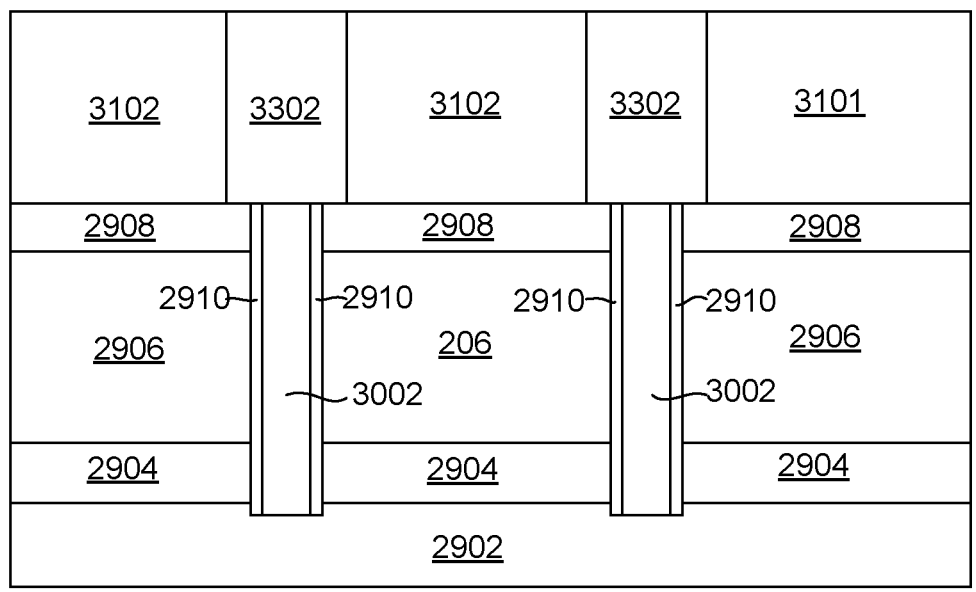

An electrically conductive contact material 3302 is then deposited to fill the openings 3202 and is preferably deposited sufficiently to extend out of the openings 3202 as shown in FIG. 17. The electrically conductive material 3302 is preferably tungsten (W) or tantalum nitride (TaN) with a TiN liner, and can be deposited by sputter deposition, chemical vapor deposition, atomic layer deposition, etc. After deposition of the electrically conductive contact material 3302 a chemical mechanical polishing process can be performed to remove portions of the contact material 3302 that extend out of the openings 3202, leaving a structure with contacts 3302 surrounded by dielectric layers 3102 as shown in FIG. 18. The contact 3302 is advantageously formed so as to be in direct contact with the upper surface of the semiconductor column 3002. Also, as seen in FIG. 18, the contact 3302 can be larger than the underlying semiconductor channel 3002 which facilitates photolithographic patterning by easing alignment requirements.

Figure 19:
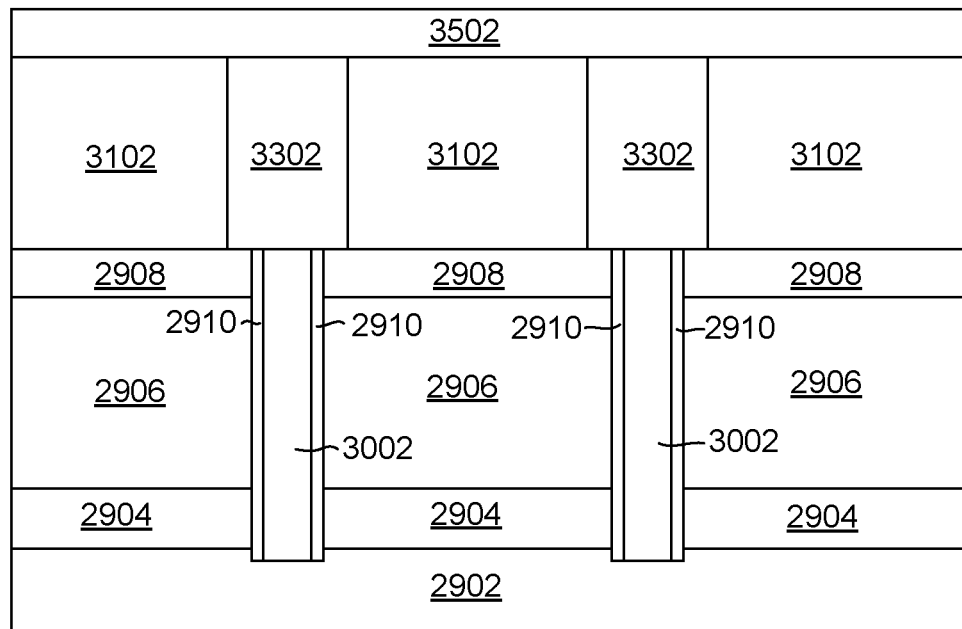
Figure 20:
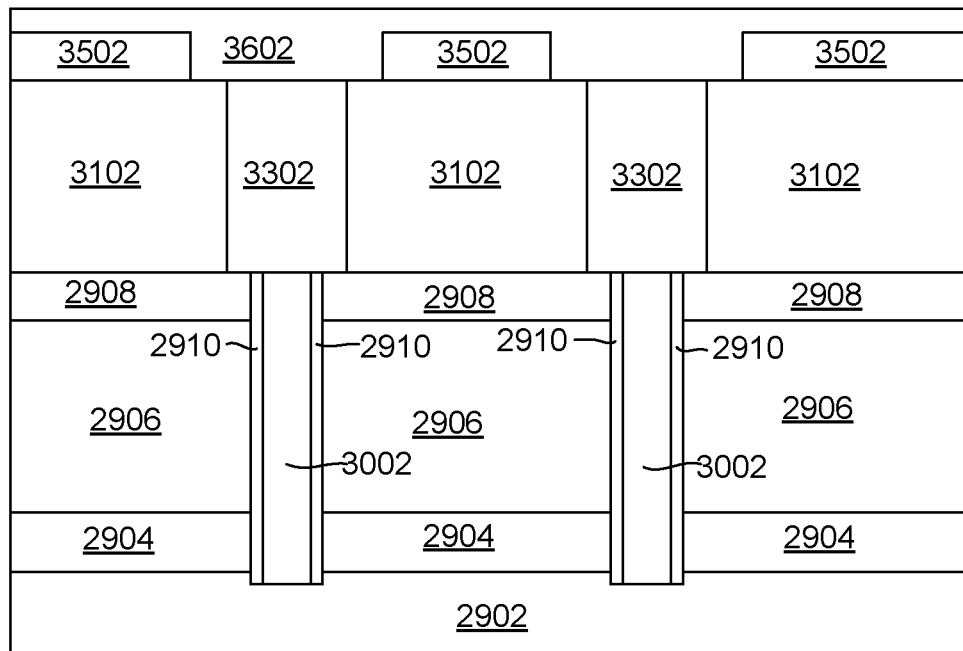

With reference now to FIG. 19, another dielectric layer 3502 is deposited over the contacts 3302 and dielectric layer 3102. This dielectric layer 3502 is preferably an oxide or nitride such as $SiO_2$ or SiN. Then, a masking and etching operation is performed to remove selected portions of the dielectric layer 3502 over the contacts 3302. An electrically conductive bottom electrode material 3602 is then deposited over the dielectric layer 3502 and into the openings in the dielectric layer 3502, leaving a structure as shown in FIG. 20. The openings in the dielectric layer 3502 larger, smaller or the same size as the contact structures 3102, and magnetic tunnel junction element (MTJ) the construction of which will be described herein below. The bottom electrode material 3602 is preferably Ta, TaN or TiN, which provides good electrical conductivity, but also provides a good surface for growing the magnetic stack of the MTJ or other memory element. This advantageously promotes good crystalline structure of a later formed magnetic tunnel junction.

Figure 21:
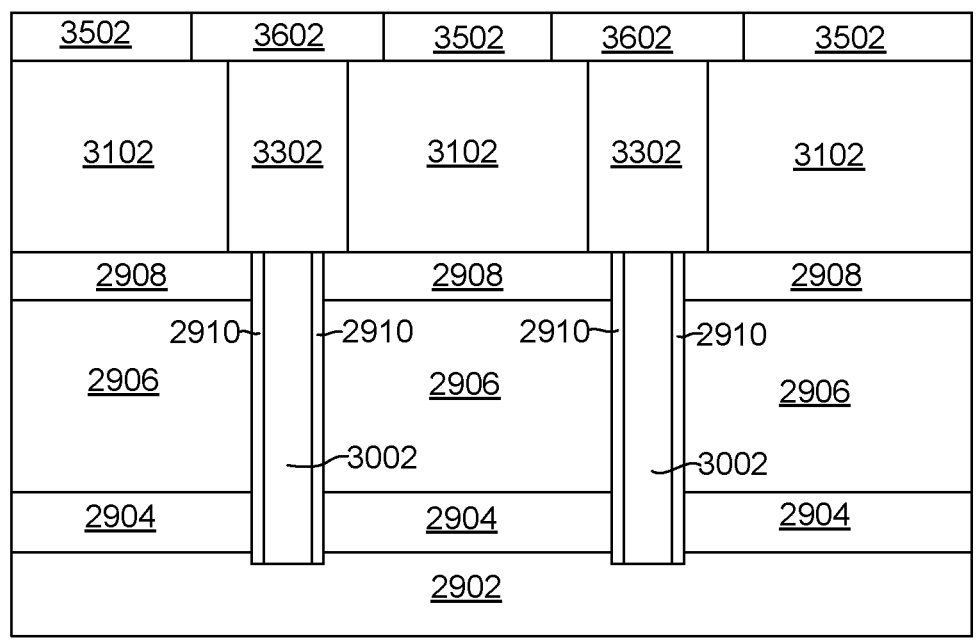

A chemical mechanical polishing process (CMP) can then be performed leaving a structure as shown in FIG. 21 with separate bottom electrode structures 3602 formed over the contacts 3302. The TaN bottom electrode structures 3602 are preferably very smooth as a result of the chemical mechanical polishing to provide a good surface for the formation of a magnetic tunnel junction structure thereon. The Making bottom electrodes 3602 larger than the contacts 3302 and the yet to be formed MTJ structure facilitates alignment of multiple photolithographic processes, for example, by reducing the need for close alignment of the photolithography used to define the bottom electrode with the previous photolithography used to form the contacts 3302. Similarly, this larger size of the bottom electrode 3602 reduces the need for close alignment with the yet to be formed MTJ.

Figure 22:
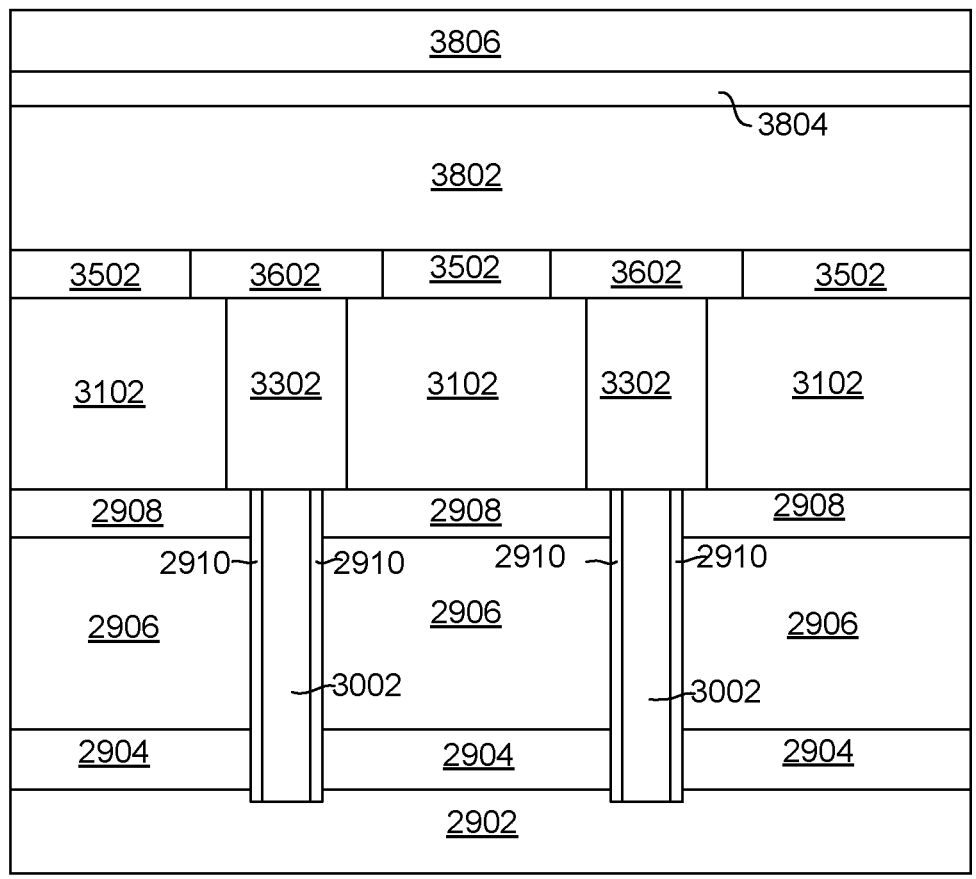

With reference now to FIG. 22, a series of memory element layers, designated generally as 3802 in FIG. 22 is deposited full film over the bottom electrode 3602 and dielectric layer 3502. The series of memory element layers 3802 can include various layers making up a magnetic tunnel junction element such as memory element 100 of FIG. 1, or could include various other layers to form a different type of memory element structure, such as but not limited to a phase change memory element (PCM). A layer of TaN 3804 hard mask can be deposited over the series of memory element layers 3802. The layer of TaN can function as a hard mask for the memory element layers 3802 and can also function as an upper electrode, as will be seen. A mask layer 3806 can be deposited over the layer of TaN 3804. The mask layer 3806 can include a layer of photoresist, and may include other layers as well, additional dielectric layer, bottom antireflective layer, etc.

Figure 23:
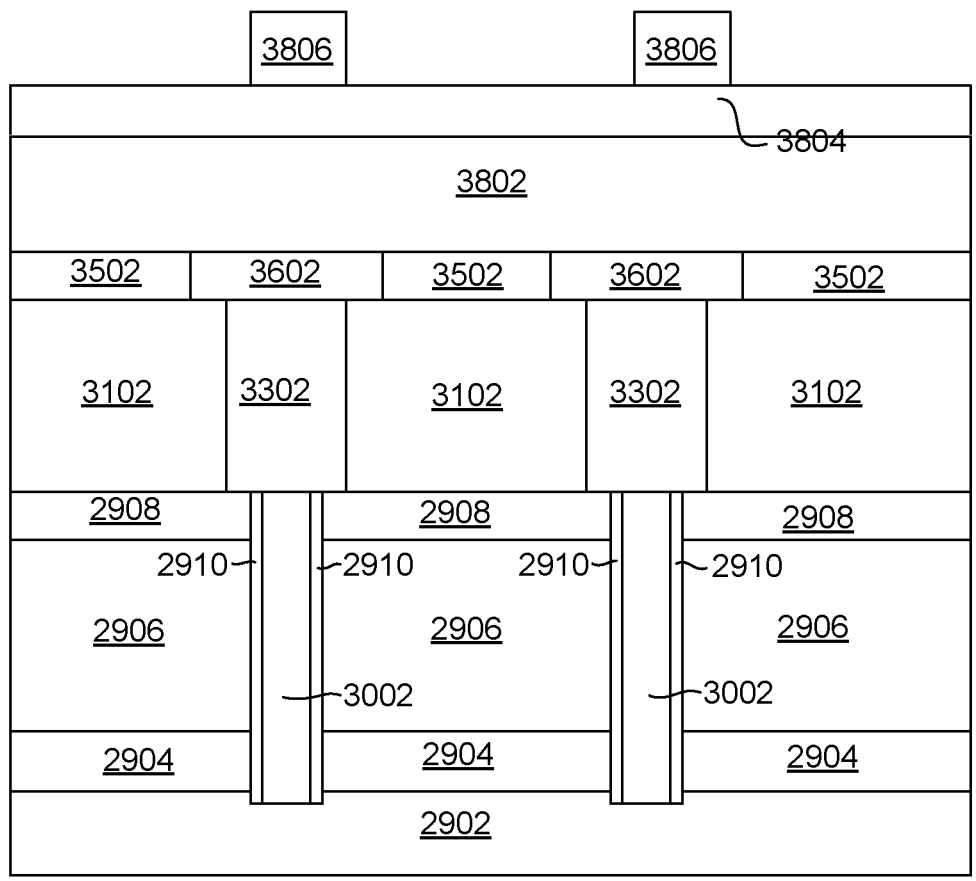
Figure 24:
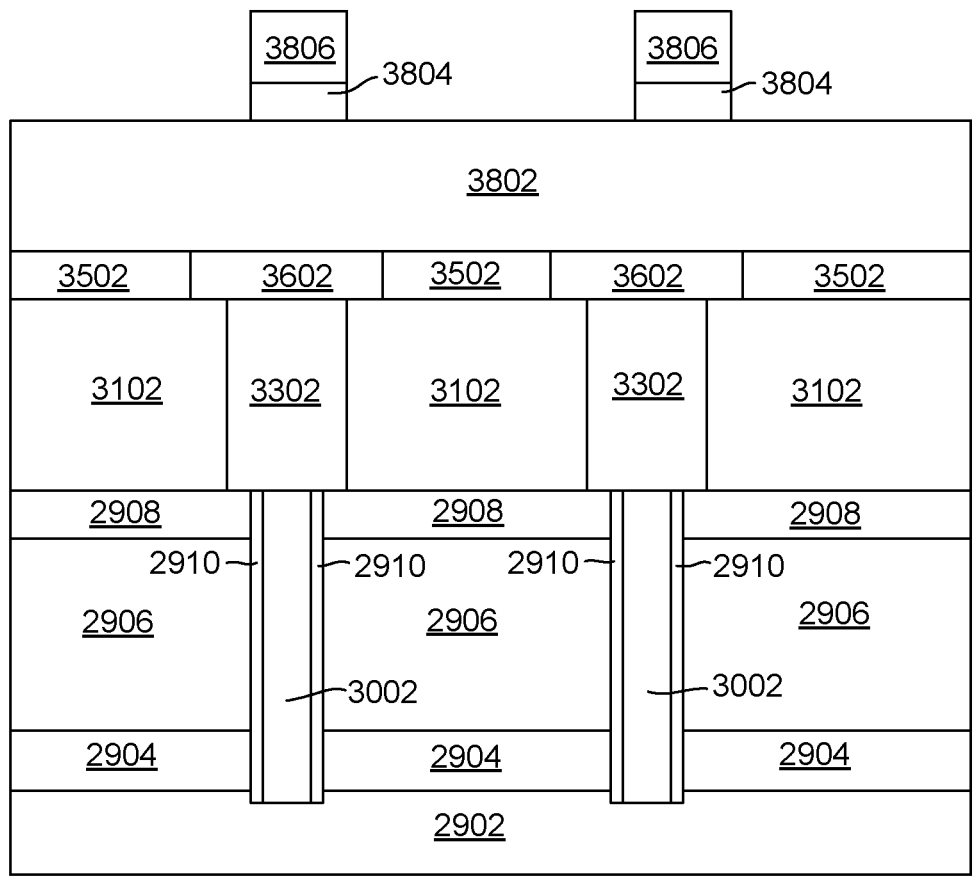
Figure 25:
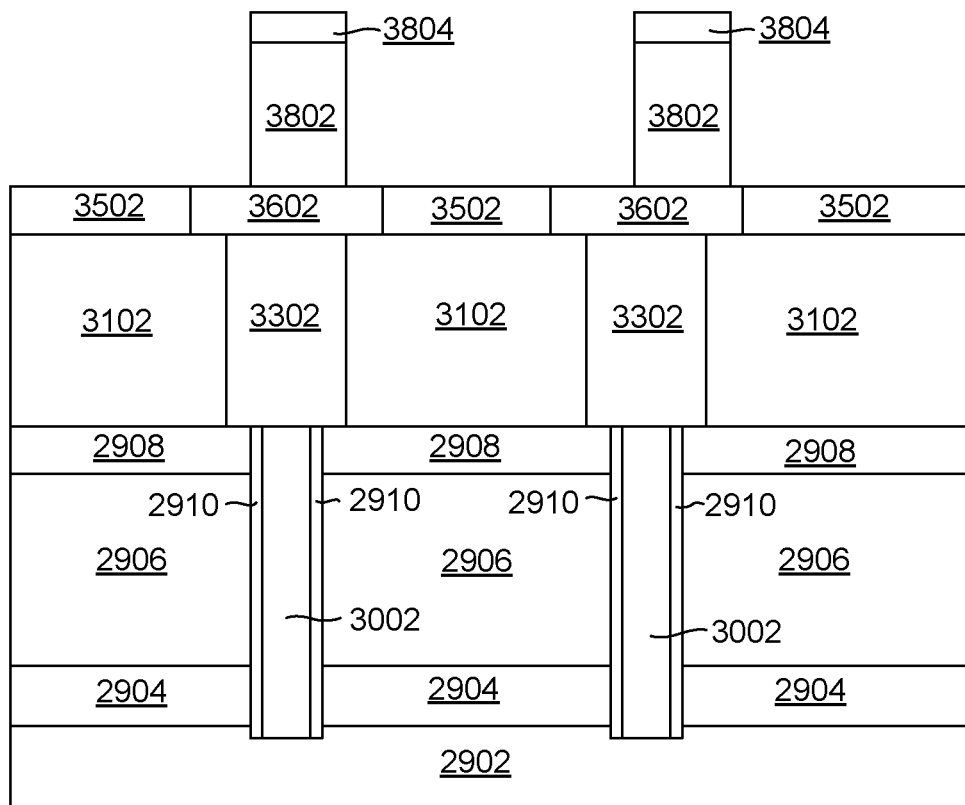
Figure 26:
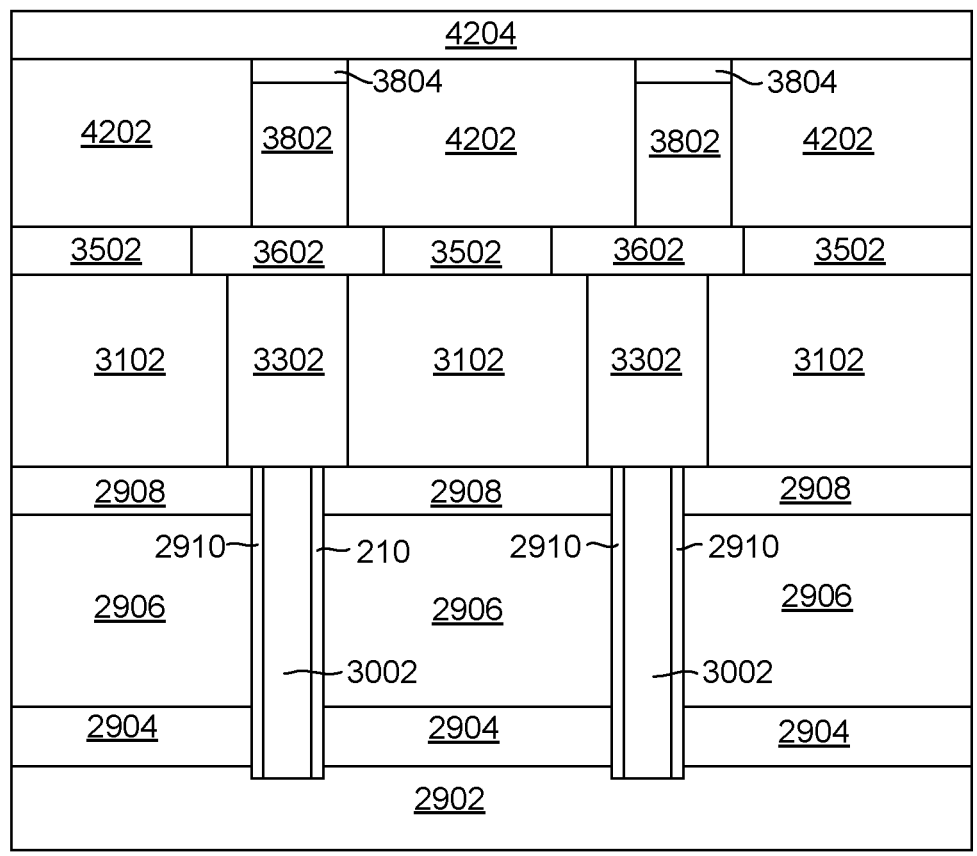

With reference now to FIG. 23, the mask layer 3806 can be photolithographically patterned to form memory element defining mask patterns. Then, a reactive ion etching can be performed to transfer the image of the mask pattern 3806 onto the underlying TaN layer 3804, leaving a structure such as shown in FIG. 24. The photoresist layer can be removed, and a material removal process such as ion beam etching (IBE) can then be performed to transfer the image of the mask layers 3804, 3806 onto the underlying series of memory element layers 3802, thereby forming magnetic element pillars 3802 as shown in FIG. 25. As can be seen, the bottom electrodes 3602 can be wider than the memory element pillars 3802, which reduces the criticality of the alignment of the lithography used to define the memory element pillars 3802, and provides electrical contact between the contact and memory element 3802. After the memory element pillars 3802 have been formed as described above, dielectric isolation layers 4202 can be deposited to encapsulate the magnetic pillars 3802 and fill the gap between the pillars 3802. This can be followed by a chemical mechanical polishing process that stops on top of the TaN hard mask 3804. An electrically conductive line 4204 can then be formed, leaving a structure as shown in FIG. 26.

In an alternate embodiment, the bottom electrode material 3602 can be deposited along with the memory element stack 3802, and the bottom electrode 3602 can be defined after the memory element 3802 has been defined. In that case, a first masking and etching process can be performed to define the memory element pillar 3802. Then, a protective layer such as an oxide or nitride can be deposited to protect the sides of the memory element structure 3802, and a second etching process can be performed to remove portions of the bottom electrode material that are not covered by the defined memory element structure. Or, alternatively, a second masking and etching process can be performed to define the bottom electrode 3602 after defining the memory element pillars 3802.

It should be pointed out that, while the above described forming a memory element in the form of a perpendicular magnetic tunnel junction (pMTJ) over a vertically disposed selector device that includes an epitaxial semiconductor column 3002, this is by way of example. Other switchable memory devices can be used in lieu of or in addition to a pMTJ device, such as for example: an MTJ having an in-plane magnetization; toggle MTJ, phase change memory element (PCM); an ReRAM element; and or spin orbit torque (SOT) memory element.

Figure 27:
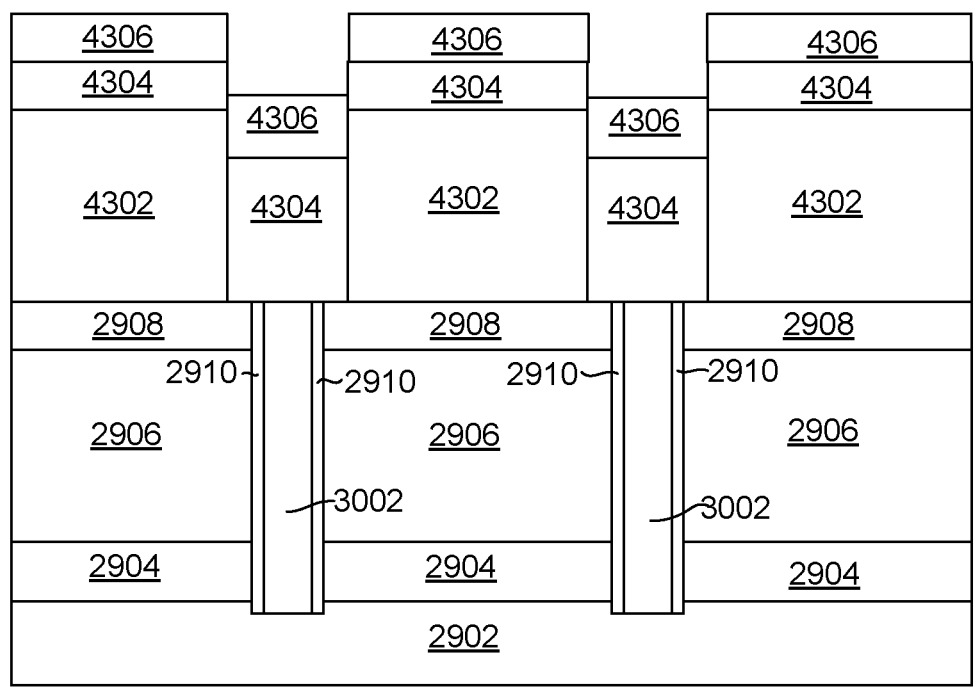
FIGS. 27-28 show a portion of a magnetic memory array in various intermediate stages of manufacture in order to illustrate a method for manufacturing a magnetic memory array according to an alternate embodiment.
Figure 28:
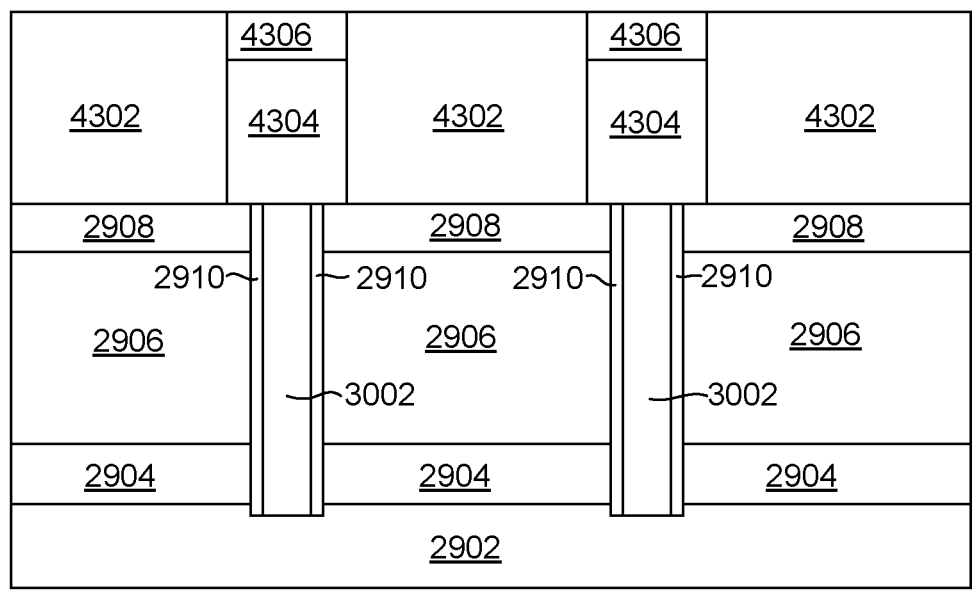

FIGS. 27-28 illustrate a method for manufacturing a magnetic memory array according to another embodiment. Starting with a structure such as that shown in FIG. 15, a dielectric layer 4302 such as silicon oxide is formed having openings formed over the semiconductor channel 3002. As before, the openings formed in the oxide layer 4302 can be formed by a combination of masking and etching, and are preferably formed to have a larger diameter than the semiconductor channel 3002 and also larger than the magnetic memory elements yet to be formed. A layer of electrically conductive contact material 4304 is then formed followed by a bottom electrode 4306, leaving a structure such as shown in FIG. 28. The contact material 4304 can be tungsten W with a TiN liner or some other suitable electrically conductive material. After the deposition of the contact material 4304 a chemical mechanical polishing can be performed, and a recess is formed in the contact material. Then, the bottom electrode material 4306, preferably TaN, is deposited over the contact material 4304. The bottom electrode layer 4306 is preferably TaN, but could be some other nonmagnetic, electrically conductive material. The layers 4304, 4306 can be deposited by a process such as sputter deposition, atomic layer deposition chemical vapor deposition etc.

After deposition of the bottom electrode material, 4306, a second chemical mechanical polishing process can be performed, leaving a planar surface as shown in FIG. 28. This method, which can be referred to as a damascene process, reduces the number of processing steps by forming the contact and bottom lead electrode 4304, 4306 in a common patterning process, and results in contact and bottom electrode structures having the same width with self-aligned side-walls. After formation of the contacts 4304 and bottom electrode 4306, a memory element such as an MTJ element or some other switchable memory element can be formed over the bottom electrode 4306 by processes such as described above.

Figure 29:
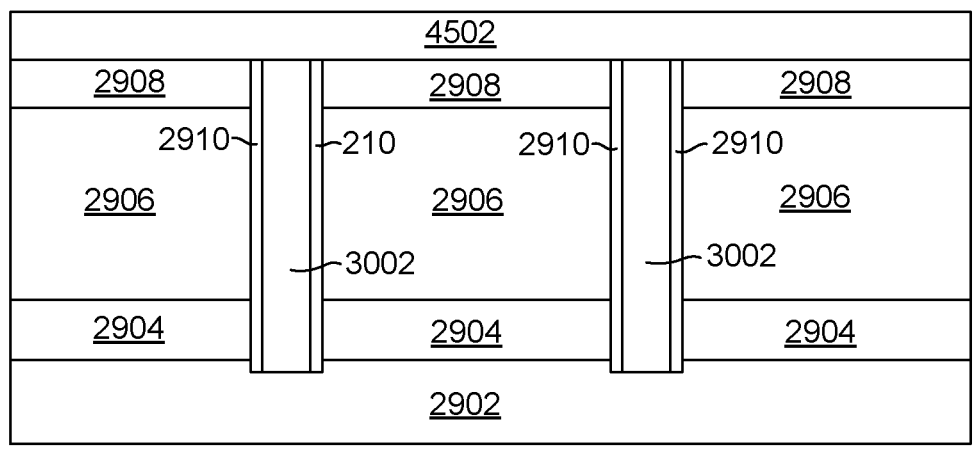
FIGS. 29-33 show a portion of a magnetic memory array in various intermediate stages of manufacture in order to illustrate a method for manufacturing a magnetic memory array according to yet another alternate embodiment.
Figure 30:
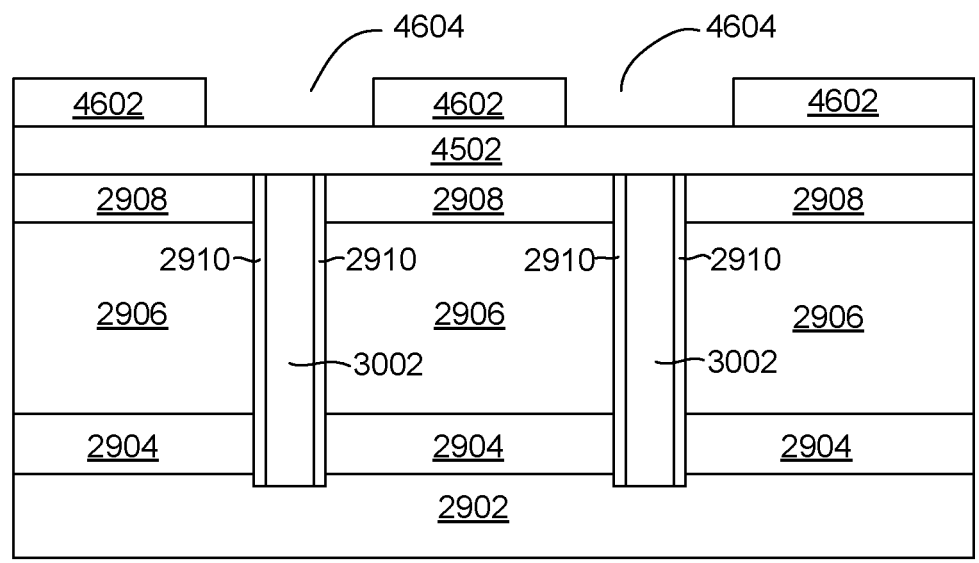

FIGS. 29-33 show a portion of a magnetic memory array in various intermediate stages of manufacture in order to illustrate a method for manufacturing a magnetic memory array according to another embodiment. Starting with a planarized channel structure as described above with reference to FIG. 14, a layer of dielectric material 4502 is deposited, leaving a structure as shown in FIG. 29. The dielectric layer 4502 is preferably an oxide or nitride, such as $SiO_2$ or SiN. Then, with reference to FIG. 30, a mask structure 4602 is formed over the dielectric layer 4502. The mask structure 4602 can include a photoresist material and may also include other materials or layers (not shown) such as one or more hard mask layers, a bottom anti-reflective coating (BARC), adhesion layer, etc. The mask 4602 is photolithographically patterned to form openings 4604 located over the vertical semiconductor columns 3002. As shown in FIG. 30, the openings 4604 can be formed with a diameter that is larger than the diameter of the semiconductor channel structure, and also larger than the diameter of a yet to be formed magnetic memory element.

Figure 31:
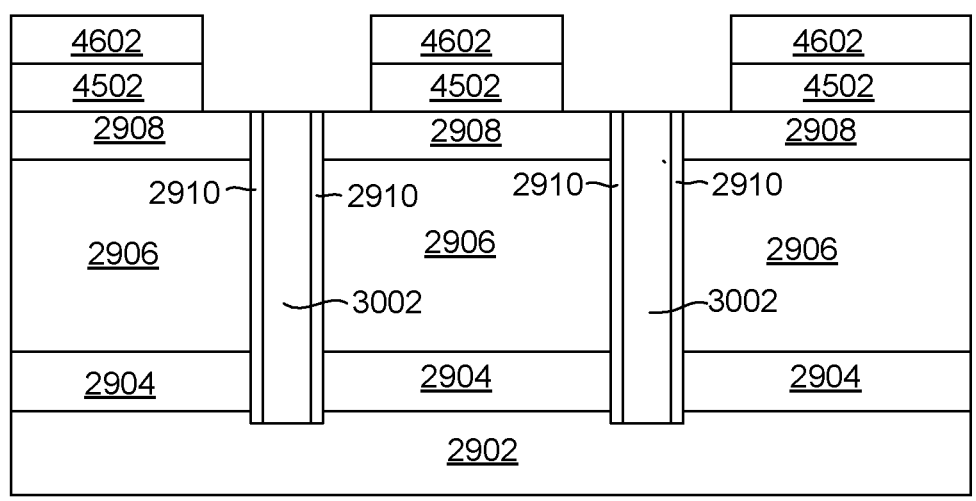

Then, an etching process such as reactive ion etching can be performed to remove portions of the dielectric layer 4502 that are exposed through the openings in the mask 4602, leaving a structure as shown in FIG. 31. The etching process can be performed in a manner to expose Si in the channel 3002. For example, if the dielectric material 4502 is SiN, the etching process can be reactive ion etching performed using a fluorine chemistry. The etching is performed until the underlying vertical semiconductor channel 3002 has been exposed.

Figure 32:
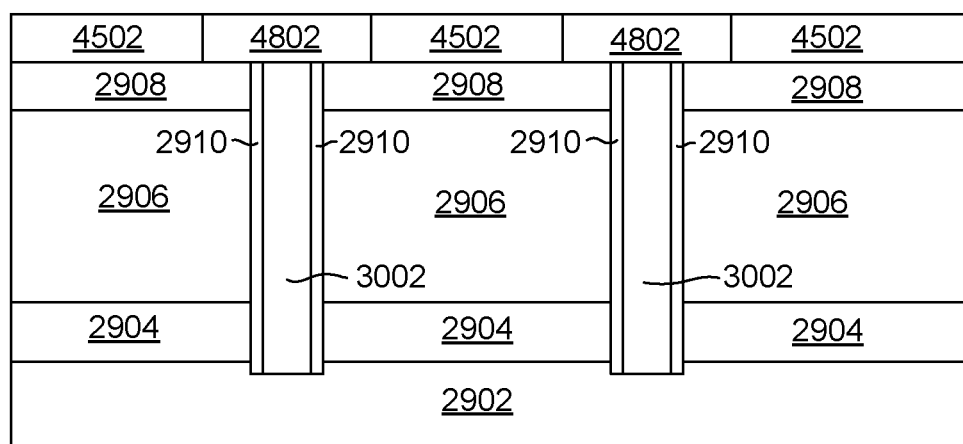

Then, an electrically conductive bottom electrode material 4802 is deposited and a chemical mechanical polishing process is performed to remove portions of the conductive material extending over the surface, leaving a structure as shown in FIG. 32. The mask 4602 (FIG. 31), including the photoresist portion is removed prior to depositing the electrically conductive bottom electrode material 4802. The bottom electrode material can be of various electrically conductive materials, and is preferably TaN, which can be deposited by sputter deposition, chemical vapor deposition, atomic layer deposition, etc. The deposition of bottom electrode material 4802 followed by chemical mechanical polishing (CMP) provides a damascene process that results in bottom electrode structures 4802 surrounded by dielectric material 4502 as shown in FIG. 32. As can be seen, the electrode 4802 is advantageously formed directly on and in contact with the Si column 3002, which optimizes electrical conduction through to the memory element and also eliminates additional processing steps which would otherwise be needed to form a separate contact structure.

Figure 33:
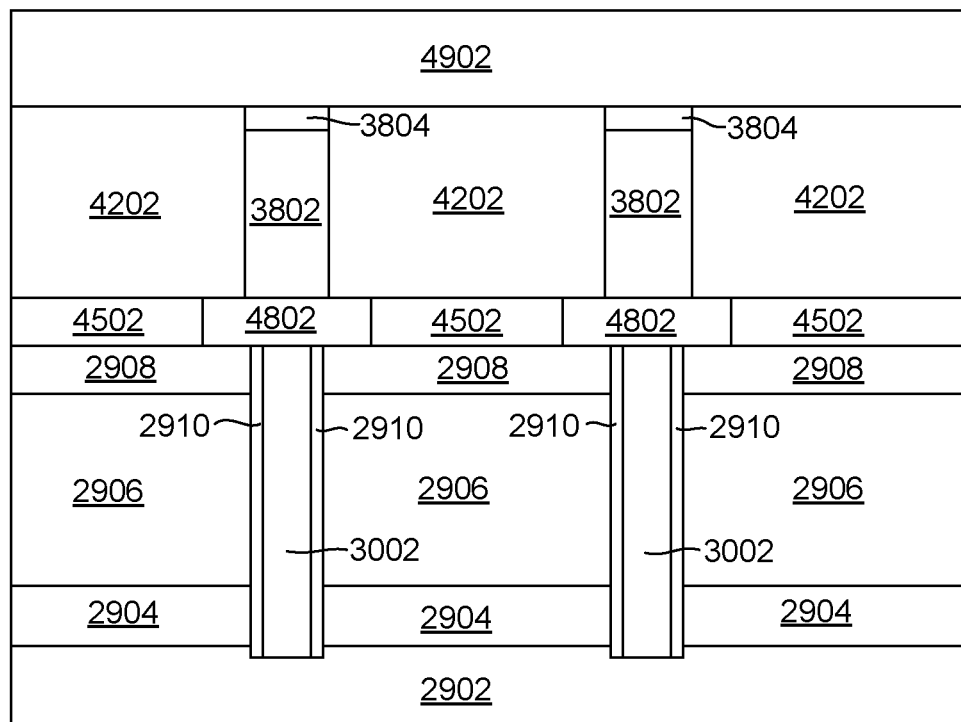

After forming the bottom electrode structure 4802 as described above, an array of magnetic memory elements can be formed over and in contact with the bottom electrode structure. Processes for forming the memory element structures can be the same or similar to those described above such as with reference to FIGS. 22-26. With reference to FIG. 33, a magnetic tunnel junction element 3802, or other switchable memory element, is formed over each of the bottom electrode structures 4802. A top electrode 3804, which is preferably TaN and which can also function as a hard mask layer for definition of the magnetic tunnel junction layer 3802 is formed over each of the magnetic tunnel junction elements, and also serves as a top electrode. A dielectric isolation layer 4202 can be formed to surround and encapsulate each of the magnetic tunnel junction elements 3802, and is formed so as to fill the gaps between the MTJ elements. An electrically conductive line 4902, which can function as a "bit-line" can be formed over and connected with one or more of the top electrodes 3804.

Figure 34:
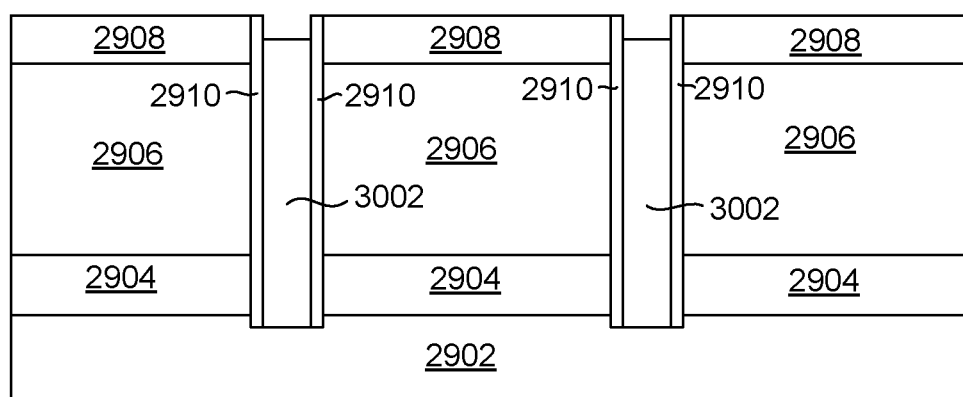
FIGS. 34-36 show a portion of a magnetic memory array in various intermediate stages of manufacture in order to illustrate a method for manufacturing a magnetic memory array according to another alternate embodiment.
Figure 35:
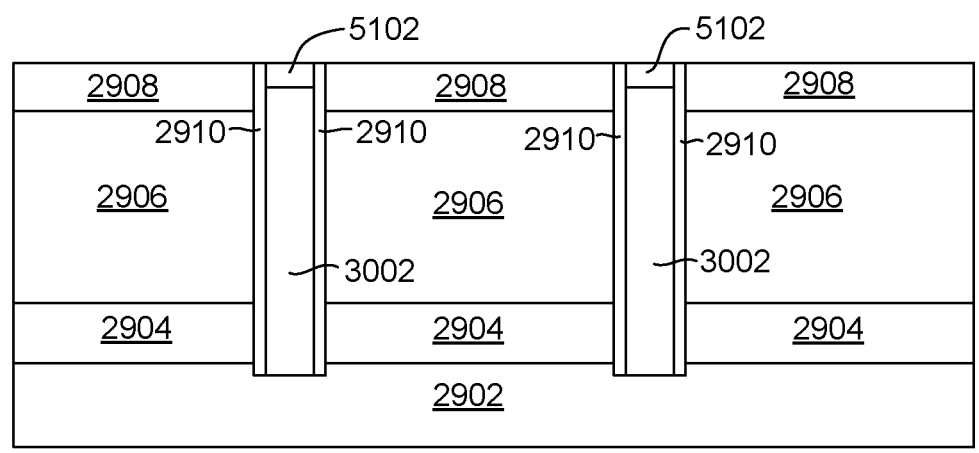
Figure 36:
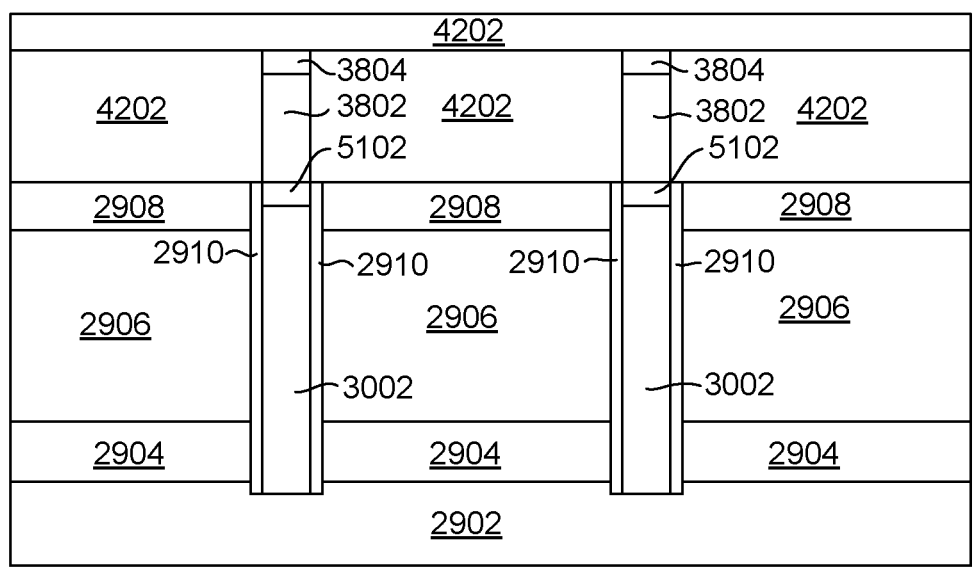

FIGS. 34-36 show a magnetic memory array in various intermediate stages of manufacture in order to illustrate a method for manufacturing a magnetic memory array according to yet another embodiment. Starting with a planarized vertical channel selector structure as previously described with reference to FIG. 15, a selective etching process can be performed to selectively remove an upper portion of the semiconductor column 3002, thereby forming a recess in the top of the semiconductor column 3002 as shown in FIG. 34. The etching process can be a reactive ion etching process or wet etch using a chemistry that is chosen to preferentially remove the semiconductor material 3002 at a faster rate than the surrounding material such as the oxide layers 2910, 2908. For example, if the semiconductor column 3002 is Si, then the reactive ion etching can be performed in an atmosphere that contains $Cl_2$. The etching process is performed until the recess formed in the upper portion of the semiconductor column 3002 reaches a depth that is at least as deep as a thickness of a desired bottom electrode structure. The original height of the semiconductor column 3002 should be adjusted accordingly, in order to compensate for the removal of the top portion of the semiconductor column 3002.

After forming the recess in the semiconductor channel material, an electrically conductive bottom electrode material 5102 is deposited and a chemical mechanical polishing process is performed, leaving a structure as shown in FIG. 35 with a bottom electrode structure 5102 formed directly over and in contact with the vertical semiconductor channel material. In this embodiment, the bottom electrode 5102 is self-aligned with the vertical semiconductor column 3002. The bottom electrode material 5102 is preferably TaN and can be deposited by sputter deposition, atomic layer deposition, chemical vapor deposition, etc.

After the bottom electrode 5102 has been formed as described above, an array of magnetic memory elements 3802 can be formed directly over the bottom electrodes 5102 by processes such as those previously described. As shown in FIG. 36 this can include forming an array of magnetic tunnel junction elements, or other switchable memory element 3802 over each of the bottom electrodes 5102. A TaN upper electrode 3804 which can also serve as a hard mask for definition of the magnetic tunnel junction element 3802 can be formed over the magnetic tunnel junction element. The magnetic tunnel junction elements 3802 and TaN upper electrode 3804 can be surrounded by a dielectric isolation layer 4202, which can be an oxide, nitride or combination of these or other materials. A chemical mechanical polishing process can then be performed to planarize the structure and expose the upper electrode 3804. An electrically conductive lead (which can be a bit-line) can be formed over and electrically connected with one or more of the upper electrodes. The magnetic tunnel junction or other memory element can have a diameter or width that equal to that of the bottom electrode 5102 and that can be larger or smaller than the silicon channel structure 3002.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A memory device comprising:
    a selector comprising an epitaxial semiconductor column having a side surrounded by gate dielectric;
    an electrically conductive gate line located such that the gate dielectric separates the epitaxial semiconductor column from the electrically conductive gate line;
    a memory element; and
    an electrically conductive bottom electrode located between and electrically connecting the memory element with the epitaxial semiconductor column.

2. The memory device as in claim 1, wherein the bottom electrode has a width that is larger than a width of the memory element.

3. The memory device as in claim 1, wherein the bottom electrode has a smooth surface that contacts the memory element.

4. The memory device as in claim 1, wherein the bottom electrode contacts both the memory element and an end of the epitaxial semiconductor column.

5. The memory device as in claim 1, further comprising an electrically conductive contact located between the bottom electrode and the epitaxial semiconductor column.

6. The memory device as in claim 5, wherein the electrically conductive contact comprises one or more of W and TaN.

7. The memory device as in claim 1, wherein the bottom electrode has a width that is self-aligned with the epitaxial semiconductor column, and wherein the gate dielectric layer extends to surround a side of the bottom electrode.

8. The memory device as in claim 1, wherein the memory element is a perpendicular magnetic tunnel junction element.

9. The memory device as in claim 1, wherein the epitaxial semiconductor column comprises one or more of Si, SiGe, GaAs and GaA compounds.

10. The memory device as in claim 1, wherein the epitaxial semiconductor column comprises Si.

11. The memory device as in claim 1, wherein memory element is a tunnel junction element or a phase change element.

12. The memory element as in claim 1, wherein the bottom electrode comprises TaN.

* * * * *